United States Patent
Chen et al.

(10) Patent No.: US 9,036,417 B2
(45) Date of Patent: May 19, 2015

(54) ON CHIP DYNAMIC READ LEVEL SCAN AND ERROR DETECTION FOR NONVOLATILE STORAGE

(71) Applicant: SanDisk Technologies Inc., Plano, TX (US)

(72) Inventors: Wenzhou Chen, San Jose, CA (US); Zhenming Zhou, San Jose, CA (US); Jun Wan, San Jose, CA (US); Deepanshu Dutta, San Jose, CA (US); Yi-Chieh Chen, San Jose, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 133 days.

(21) Appl. No.: 13/761,956

(22) Filed: Feb. 7, 2013

(65) Prior Publication Data
US 2014/0063940 A1 Mar. 6, 2014

Related U.S. Application Data

(60) Provisional application No. 61/697,698, filed on Sep. 6, 2012.

(51) Int. Cl.
*G11C 16/26* (2006.01)
*G11C 16/10* (2006.01)
*G11C 11/56* (2006.01)
(Continued)

(52) U.S. Cl.
CPC ............ *G11C 16/10* (2013.01); *G11C 11/5628* (2013.01); *G11C 16/26* (2013.01); *G11C 16/3418* (2013.01); *G11C 16/349* (2013.01); *G11C 29/028* (2013.01)

(58) Field of Classification Search
USPC ............ 365/185.02, 185.03, 185.09, 185.17, 365/185.2, 185.22
See application file for complete search history.

(56) References Cited

U.S. PATENT DOCUMENTS 7,177,197 B2  2/2007 Cernea
7,471,562 B2  12/2008 Hung et al.
(Continued)

FOREIGN PATENT DOCUMENTS

WO   2012/097136 A2   7/2012

OTHER PUBLICATIONS

International Search Report and Written Opinion of the International Searching Authority dated Feb. 8, 2013, PCT Application No. PCT/US2012/055046 filed Sep. 13, 2012, 14 pages.

(Continued)

*Primary Examiner* — Andrew Q Tran
(74) *Attorney, Agent, or Firm* — Vierra Magen Marcus LLP

(57) ABSTRACT

Techniques for efficiently programming non-volatile storage are disclosed. A second page of data may efficiently be programmed into memory cells that already store a first page. Data may be efficiently transferred from single bit cells to multi-bit cells. Memory cells are read using at least two different read levels. The results are compared to determine a count how many memory cells showed a different result between the two reads. If the count is less than a threshold, then data from the memory cells is stored into a set of data latches without attempting to correct for misreads. If the count is not less than the threshold, then data from the memory cells is stored into the set of data latches with attempting to correct for misreads. A programming operation may be performed based on the data stored in the set of data latches.

17 Claims, 24 Drawing Sheets

(51) Int. Cl.
*G11C 16/34* (2006.01)
*G11C 29/02* (2006.01)

(56) References Cited

U.S. PATENT DOCUMENTS

| | | |
|---|---|---|
| 7,844,878 B2 | 11/2010 | Aasheim et al. |
| 7,859,932 B2 | 12/2010 | Mokhlesi |
| 7,876,621 B2 | 1/2011 | Sharon et al. |
| 7,903,468 B2 | 3/2011 | Litsyn et al. |
| 7,957,187 B2 | 6/2011 | Mokhlesi et al. |
| 8,201,053 B2 | 6/2012 | Aasheim et al. |
| 8,369,143 B2 * | 2/2013 | Franca-Neto et al. ... 365/185.03 |
| 8,406,053 B1 | 3/2013 | Dutta et al. |
| 2004/0153902 A1 | 8/2004 | Machado et al. |
| 2008/0263266 A1 | 10/2008 | Sharon et al. |
| 2008/0285351 A1 | 11/2008 | Shlick et al. |
| 2009/0135646 A1 | 5/2009 | Murin et al. |
| 2009/0323412 A1 | 12/2009 | Mokhlesi et al. |
| 2010/0017684 A1 | 1/2010 | Yang |
| 2010/0020611 A1 | 1/2010 | Park |
| 2010/0309719 A1 | 12/2010 | Li et al. |
| 2010/0309726 A1 | 12/2010 | Yang |
| 2011/0149650 A1 | 6/2011 | Huang et al. |
| 2012/0182810 A1 | 7/2012 | Radke et al. |
| 2013/0148425 A1 | 6/2013 | Dutta et al. |

OTHER PUBLICATIONS

Notice of Allowance and Fee(s) Due dated Jul. 17, 2013, U.S. Appl. No. 13/759,700, filed Feb. 5, 2013, 24 pages.
International Search Report and Written Opinion of the International Searching Authority dated Nov. 6, 2013, PCT Application No. PCT/US2013/049733 filed Jul. 9, 2013, 11 pages.
U.S. Appl. No. 13/239,194, filed Sep. 21, 2011.
Notice of Allowance and Fee(s) Due dated Nov. 28, 2012, U.S. Appl. No. 13/239,194, 17 pages.
Amendment Under 37 C.F.R. § 1.312 dated Dec. 14, 2012, U.S. Appl. No. 13/239,194, 8 pages.
U.S. Appl. No. 13/759,700, filed Feb. 5, 2013.

* cited by examiner

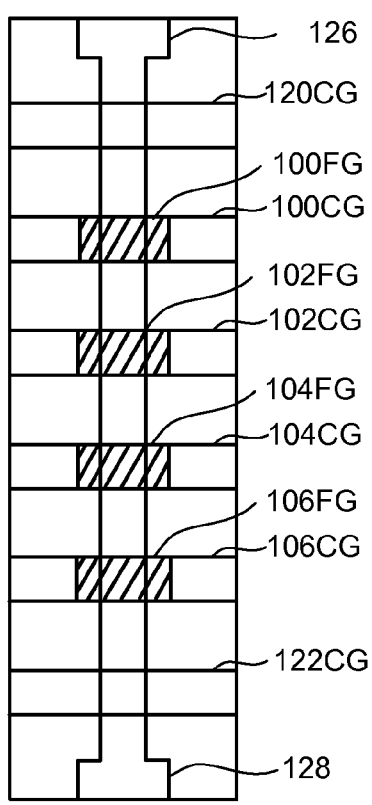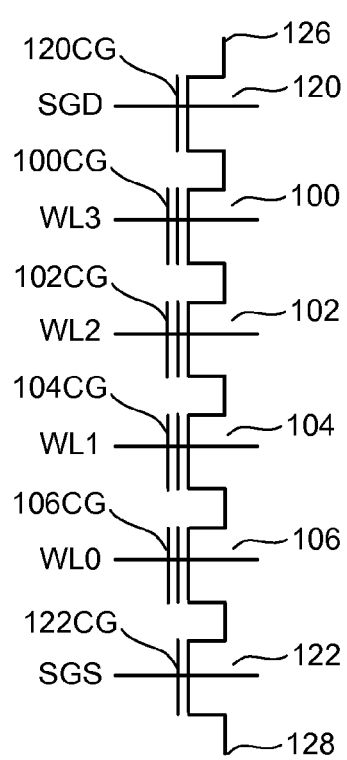

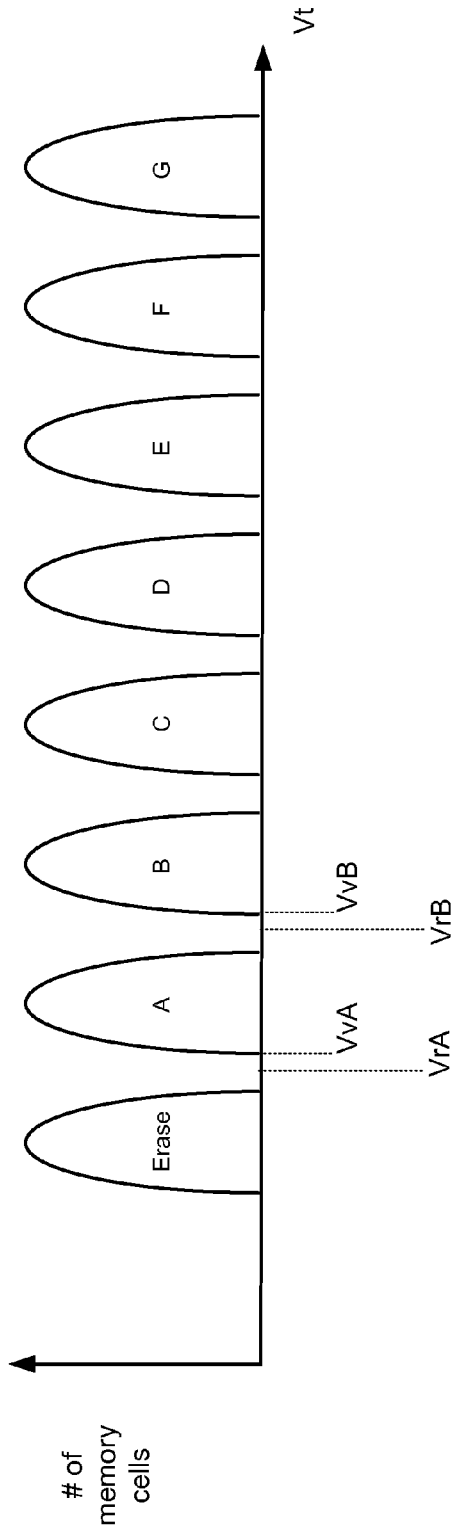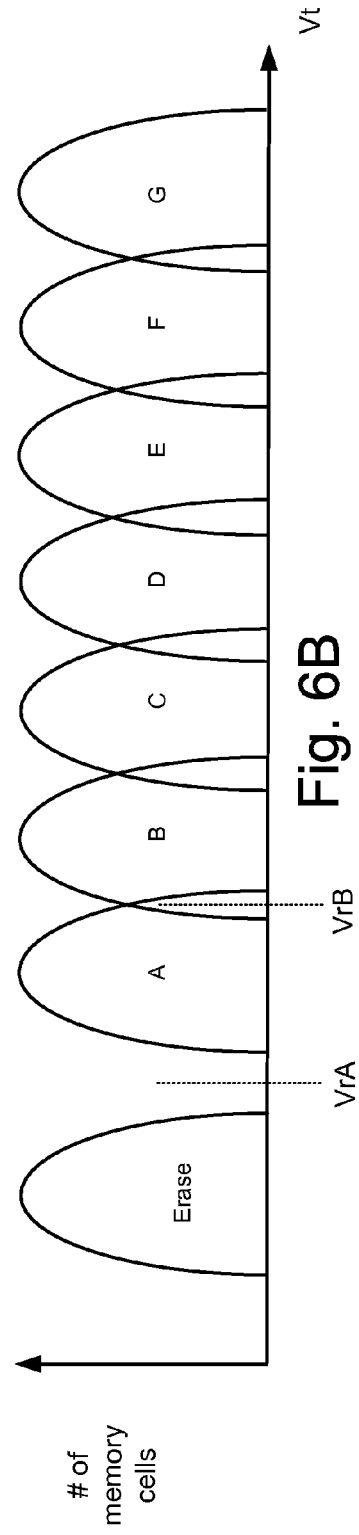

First programming pass

Second programming pass

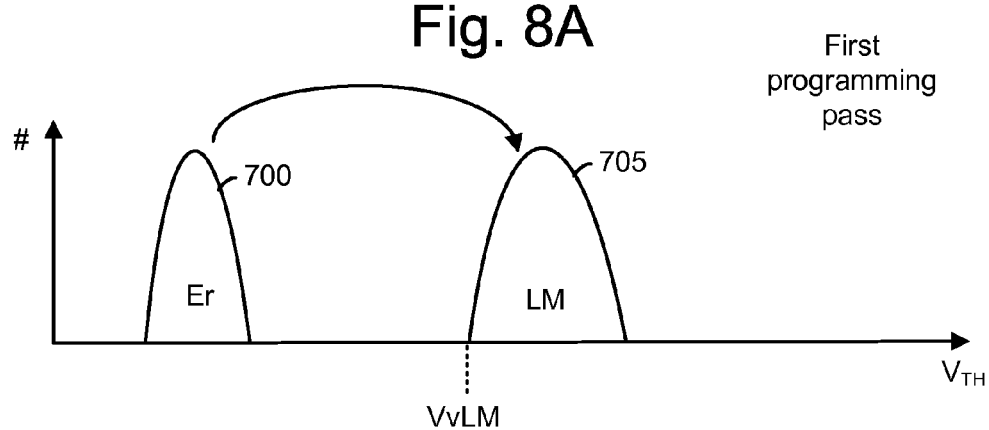
Fig. 8A — First programming pass
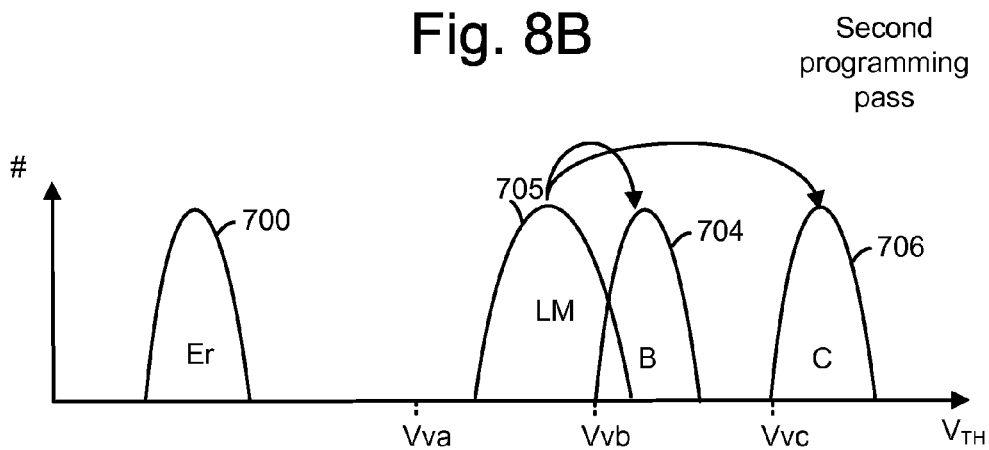
Fig. 8B — Second programming pass
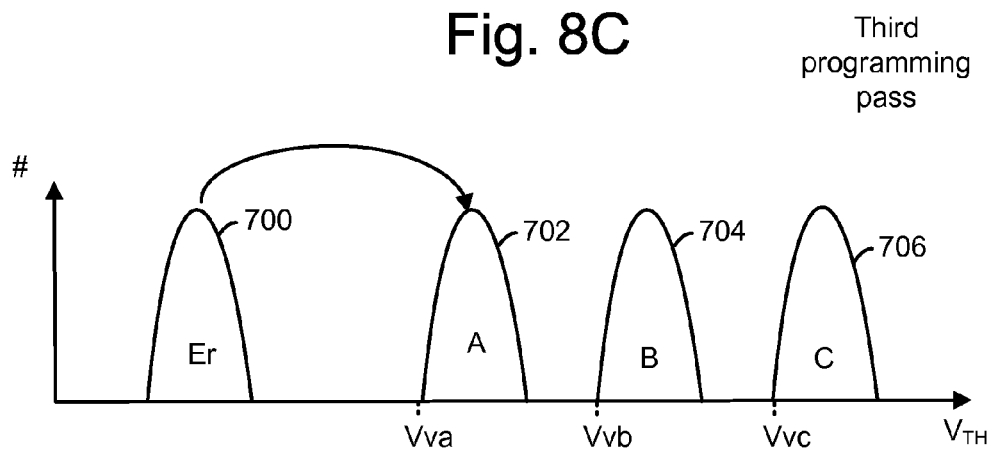
Fig. 8C — Third programming pass

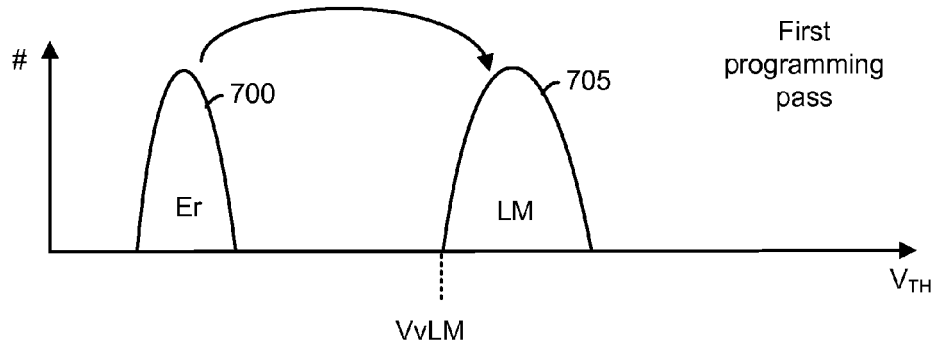
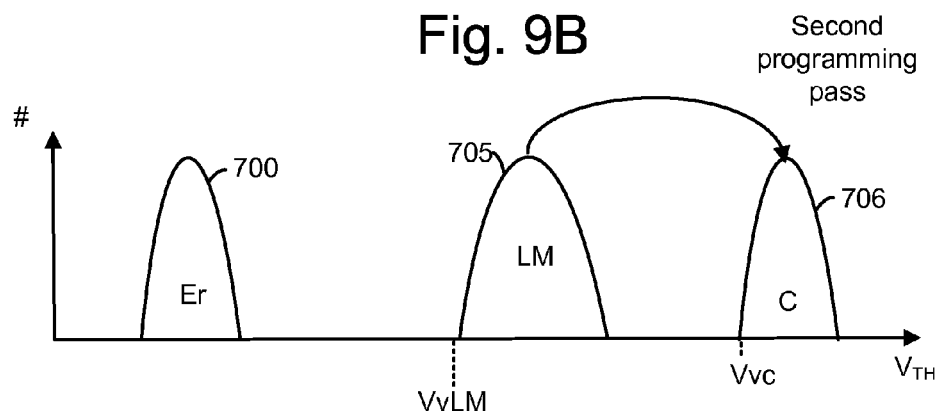
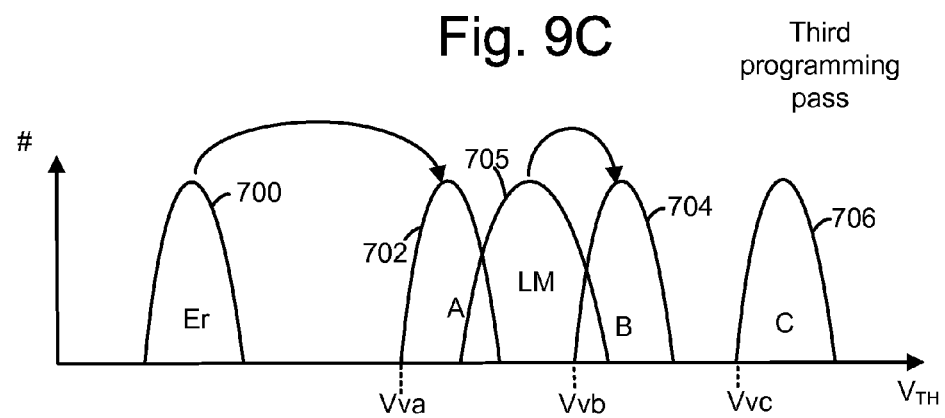

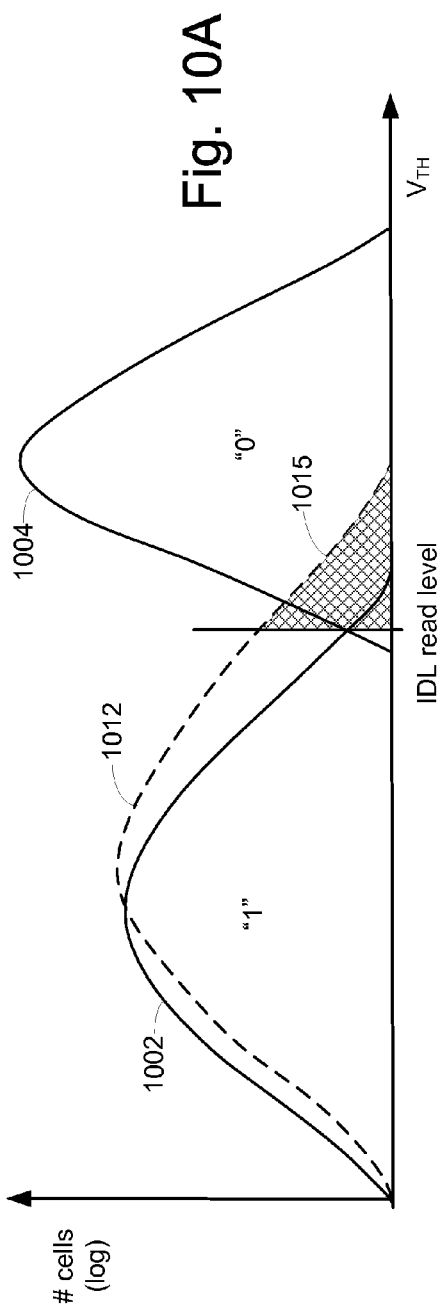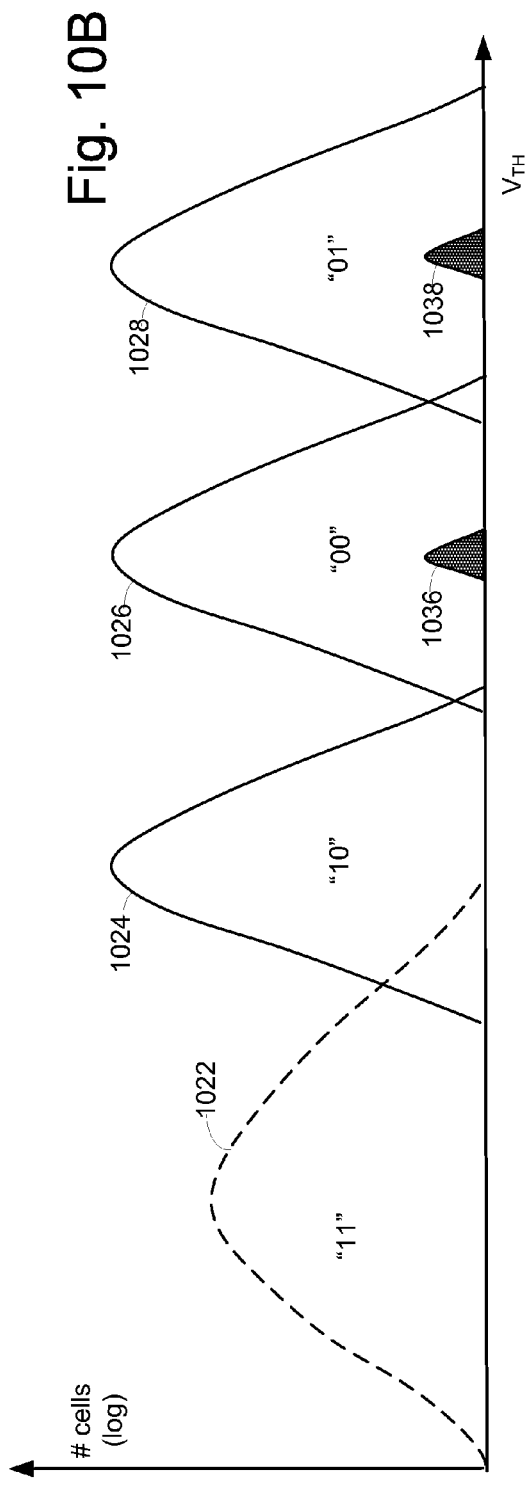

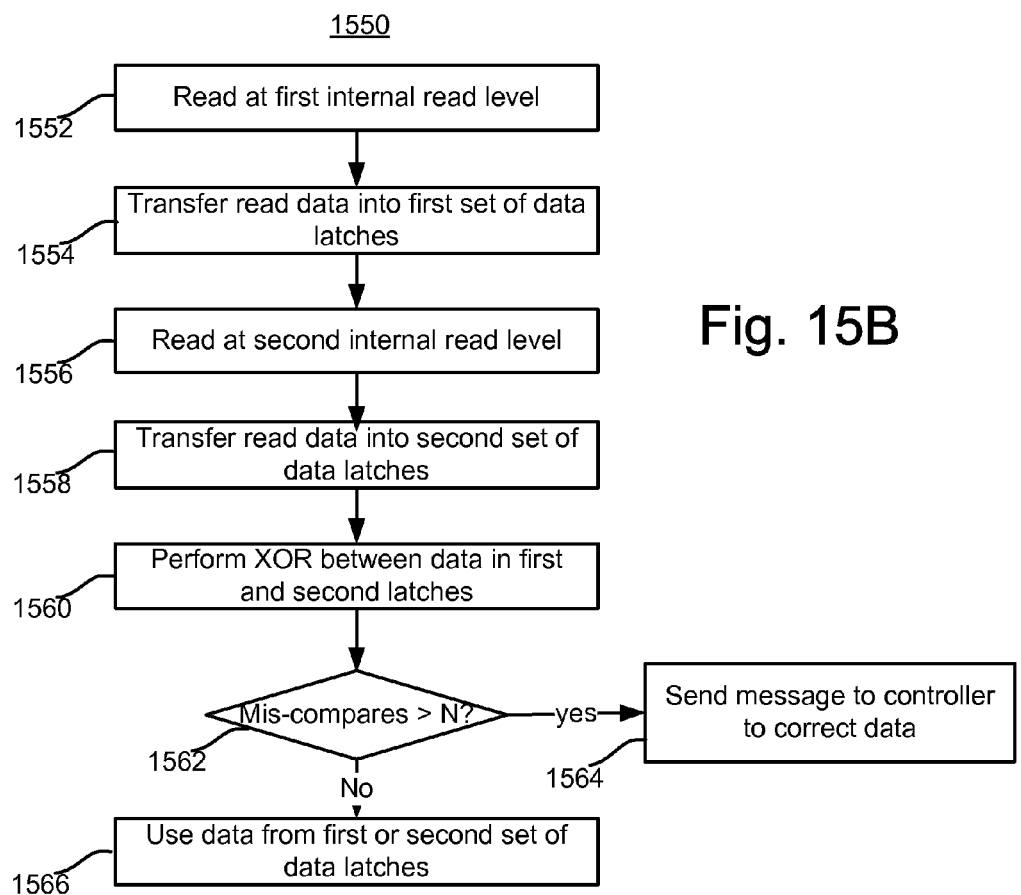

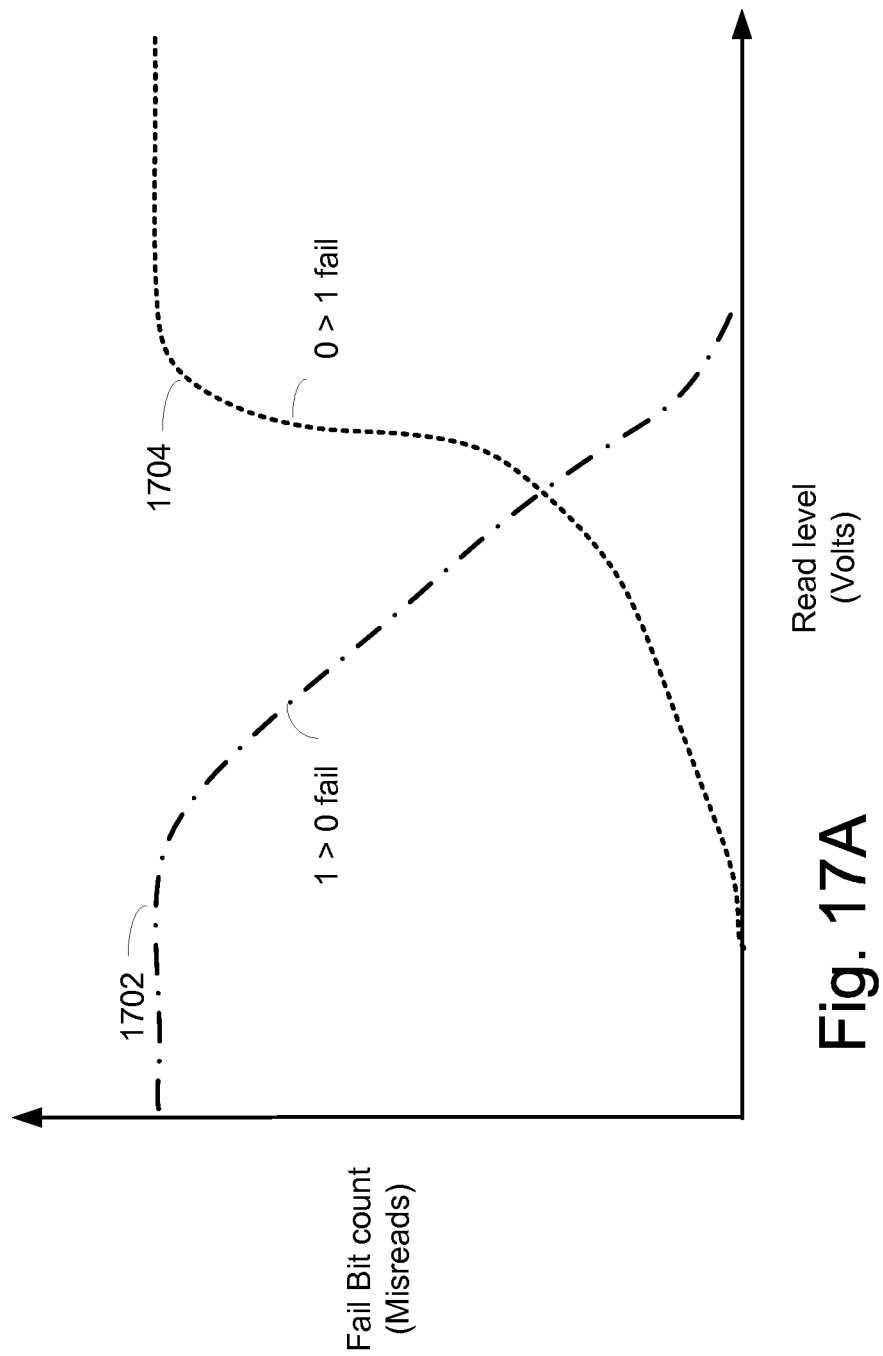

US 9,036,417 B2

ON CHIP DYNAMIC READ LEVEL SCAN AND ERROR DETECTION FOR NONVOLATILE STORAGE

PRIORITY

This application claims the benefit of U.S. Provisional Application No. 61/697,698, entitled "On Chip Dynamic Read Level Scan and Error Detection for Nonvolatile Storage," by Chen et al., filed on Sep. 6, 2012, incorporated herein by reference.

BACKGROUND

The present disclosure relates to technology for non-volatile memory.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

During a read operation, read reference voltages are applied to a set of storage elements to be read, and a determination is made as to which read reference voltage causes a storage element to become conductive. The read reference voltages are set to allow data states of the storage elements to be distinguished.

Typically, in addition to the data programmed into a group of storage elements an Error Correction Code (ECC) that has been calculated from the user data is also stored. When the data is read back, the ECC may also be read back. The ECC allows a certain number of misreads to be corrected. In one technique, both the data and the ECC are sent to a controller, which may be separate from the memory chip that contains the storage elements. The controller uses the ECC to attempt to correct any misreads. If the data still cannot be read using ECC, the controller may adjust the read levels and re-read the storage elements with the new read levels.

BRIEF DESCRIPTION OF THE DRAWINGS

FIG. 1 is a top view of a NAND string.
FIG. 2 is an equivalent circuit diagram of the NAND string.
FIG. 6A depicts an example set of Vt distributions.
FIG. 6B depicts an example set of Vt distributions.
FIGS. 8A, 8B and 8C depict one embodiment of a three pass programming sequence.
FIGS. 9A, 9B and 9C depict one embodiment of a three pass programming sequence in which the C-state is programmed prior to starting the other states.
FIG. 10A depicts example threshold distributions to illustrate a potential for misreads that may occur.
FIG. 10B shows four threshold distributions after programming an upper page without attempting to correct misreads to show a potential for mis-programming.
FIG. 15B is a flowchart of one embodiment of a process of determining how to read storage elements.
FIG. 17A depicts a graph of fail bit count (or misreads) if reading a pair of over-lapping threshold distributions, without performing error correction.

DETAILED DESCRIPTION

Figure 3:
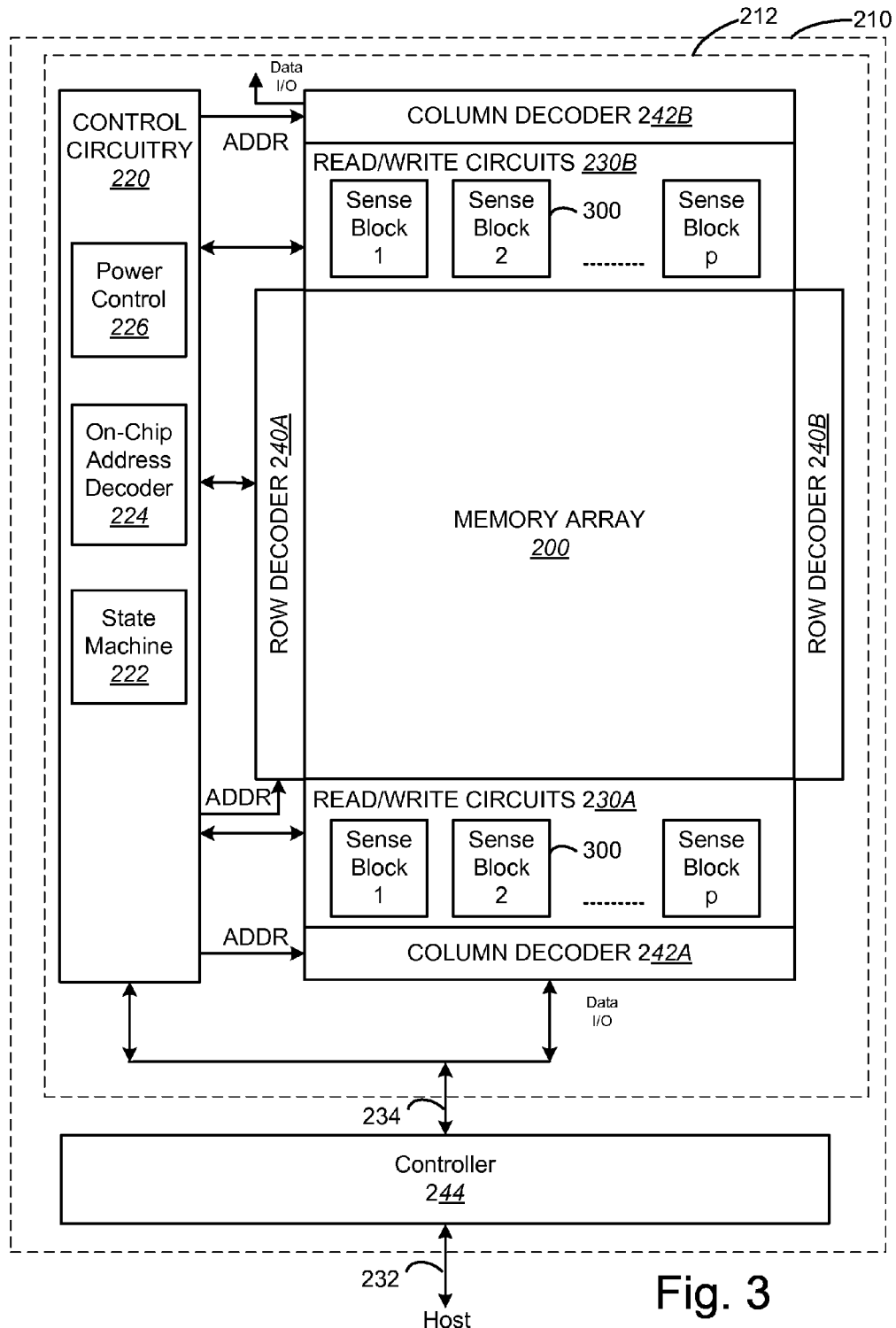
FIG. 3 is a block diagram of a non-volatile memory system.

Techniques for efficiently programming non-volatile storage are disclosed. One possible application is for programming an upper page of data accurately and efficiently in a situation in which a lower page of data has already been programmed. Another possible application is for accurately and efficiently folding data from one or more blocks that store a single bit per storage element to a block that stores multiple bits per storage element.

When programming an upper page of data into storage elements that were previously programmed with the lower page, a memory controller might only provide the upper page. However, the lower page might be needed in order to correctly complete programming of the upper page. One technique is to internally load the previously programmed lower page from the storage elements into a set of data latches on the memory chip when the request to program the upper page is received. An internal data load refers to transferring the data from the storage elements to data latches used for programming without sending the data off chip to correct for possible misreads. As will be discussed below, sometimes there may be misreads when internally loading the lower page. The number of misreads may be relatively large if a substantial amount of time has passed since programming the lower page or the storage elements have went through heavy write/erase cycles. A misread is defined as a case in which the state that is read back from the storage element is not the state to which the storage element was intended to be programmed. Note that in some embodiments misreads can be corrected by applying an error correction algorithm, providing that there are not too many misreads.

In one embodiment, when a request to program an upper page is received, a series of reads of the lower page are performed at different read levels without performing error correction. The series are reads may be analyzed to determine whether the lower page can be read with sufficient accuracy with an internal data load, or whether the lower page data that was read and associated ECC should be sent off chip to a controller to perform error correction.

In one embodiment, the analysis involves performing a bit by bit comparison to determine a count of how many storage elements showed a different reading for reads at two successive read levels. For example, if a storage element read a "1" for one read level and a "0" for the next read level, the count is incremented. A search may be performed for the two adjacent read levels for which the count is the lowest. This count may be compared with a threshold to determine whether the lower page can be read with sufficient accuracy with the internal data load. In one embodiment, the threshold is based on whether programming the upper page based on using the internally loaded lower page would lead to an unacceptable number of mis-programmed storage elements.

If the lower page can be loaded internally with sufficient accuracy, then the internally read lower page data may be stored into a set of data latches. That data may be used when programming the upper page. This avoids the need to send the lower page data off chip to the controller to perform ECC. However, if the lower page cannot be read internally with sufficient accuracy, then the lower page data that was read may be sent off chip, along with ECC, to read the lower page while applying ECC. In some cases, the read levels could be adjusted and the lower page read again, if error correction is unsuccessful at correcting misreads. Note that in many cases, the upper page is programmed soon after the lower page or the memory elements are still in early life cycle, which may result in few (if any) misreads. Therefore, in many cases the internal data load of the lower page is adequate.

In one embodiment, a memory controller requests that data from one or more single level cell (SLC) blocks be transferred to a multi-level cell (MLC) block. In one embodiment, rather than transferring the data and ECC from an SLC block to the controller to attempt to correct for misreads, an internal data load is performed of the data in the SLC. For example, data is read from storage elements in an SLC block to data latches on the memory die without sending the data off chip to attempt to correct for misreads. Then, this internally loaded data is used to program a MLC block. Note that often SLC blocks are used as a sort of short term cache. Therefore, problems associated with misreads due to shifts in threshold levels may be less than for blocks used for longer term storage. However, there still may be misreads if the SLC block is read without attempting to correct for misreads.

In one embodiment, when a request to fold data from one or more single level cell (SLC) blocks into a multi-level cell (MLC) block is received, a series of reads of a group of storage elements in an SLC block are performed at different read levels without attempting to correct for misreads. The series are reads may be analyzed to determine whether the data in the SLC block can be read with sufficient accuracy with an internal data load, or whether the data that was read and associated ECC should be sent off chip to a controller to perform error correction to attempt to correct for misreads.

If the data in the SLC block can be read internally with sufficient accuracy, then the internally read data may be stored into a set of data latches without attempting to correct for misreads. That data may be used when programming the MLC block. This avoids the need to send the data read from the SLC block off chip to the controller to perform error correction. However, if the data cannot be read internally with sufficient accuracy, then the data may be sent off chip, along with ECC, to read the data while applying error correction. In some cases, the read levels could be adjusted and the data read again, if error correction is unsuccessful at correcting misreads.

In some embodiments, a NAND memory array is used. However, note that other types of non-volatile storage may be used. NAND is an example of a flash memory system which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
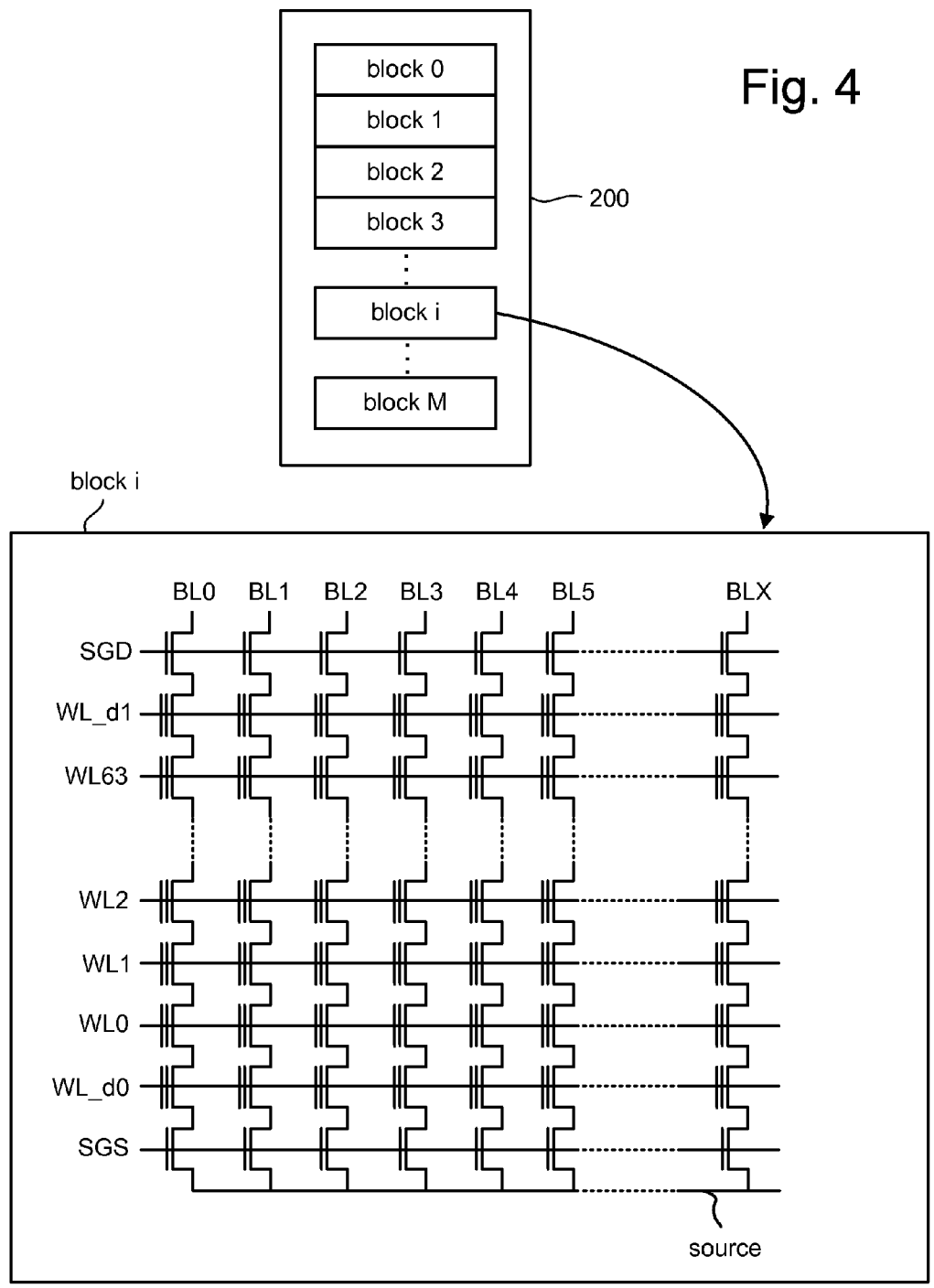
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5:
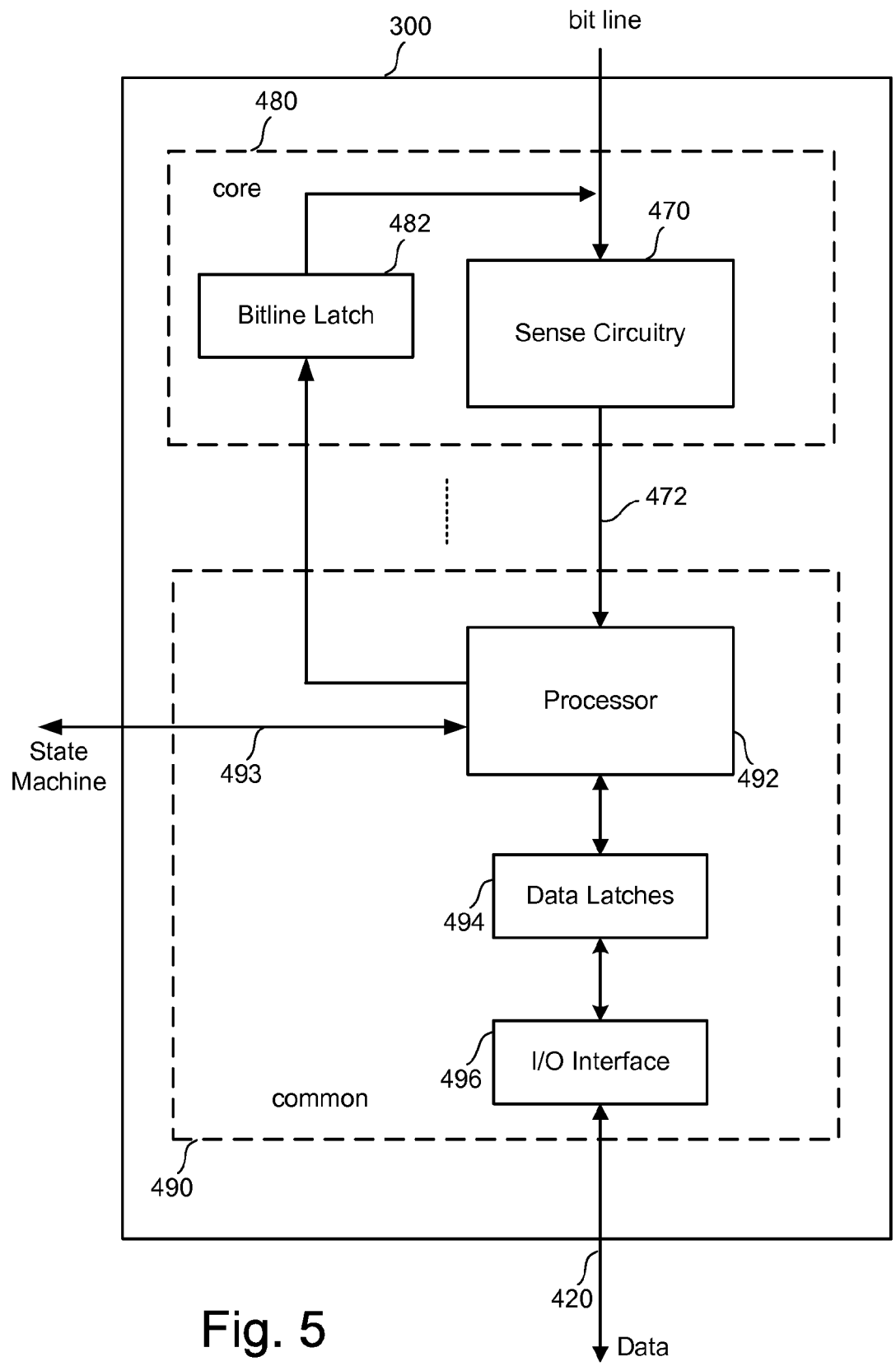
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. In some embodiments, the data latches 494 are used to store first and second read results, as a part of a process that determines whether an internal data load can be performed with sufficient accuracy. Data latches 494 may also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

Between each of the data states Erase-G are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 6C:
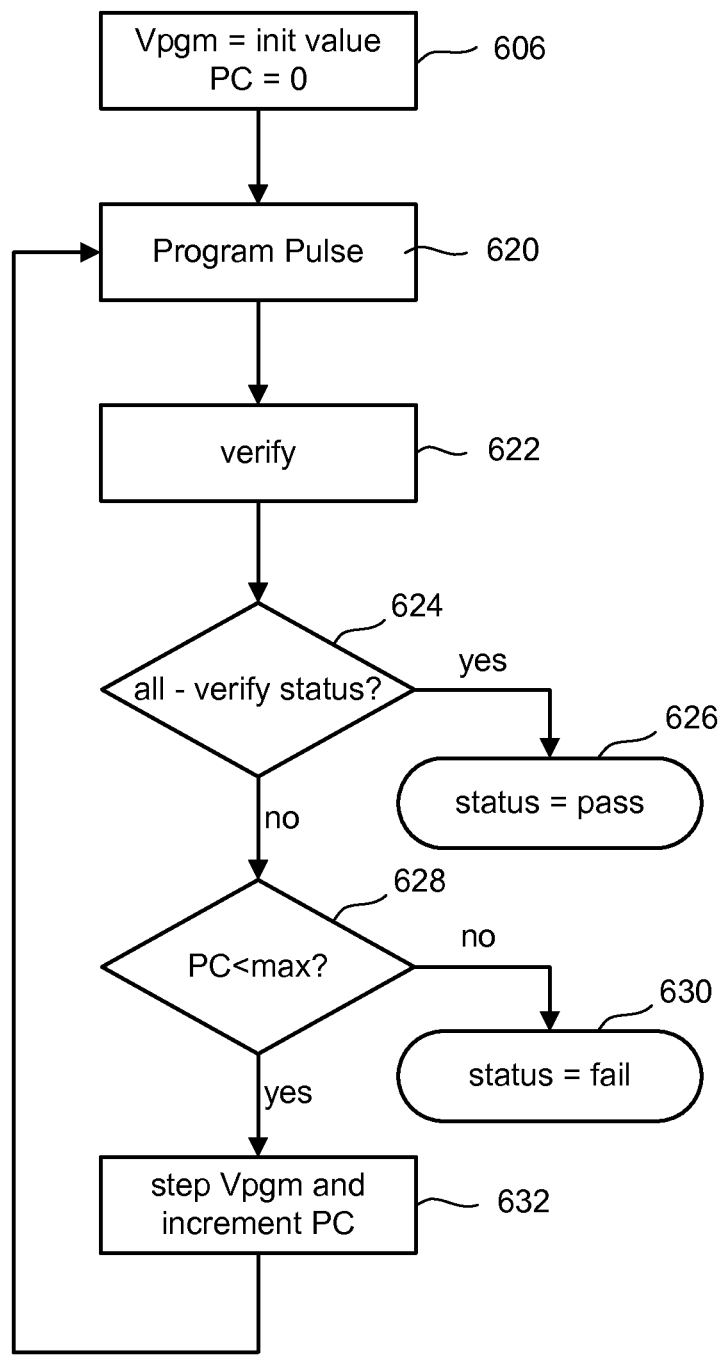
FIG. 6C is a flowchart describing one embodiment of a programming process.

FIG. 6C is a flowchart describing one embodiment of a programming process, which includes one or more verification steps. Any of the programming sequences described herein may be used, as well as other programming sequences.

In step 606, the program voltage (Vpgm) is set to an initial value. Also, in step 606, a program counter (PC) is initialized to zero. In step 620, a program pulse is applied.

In step 622, a verification process is performed. In step 624, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 624 is referring to all states having completed programming.

If verification passes, the programming process is completed successfully (status=pass) in step 626. If all of the memory cells are not all verified, then it is determined whether the program counter (PC) is less than a maximum value such as 20. If the program counter (PC) is not less than max (step 628), then the program process has failed (step 630). If the program counter (PC) is less than a maximum value (e.g., 20), then the program counter (PC) is incremented by 1 and the program voltage is stepped up to the next pulse in step 632. Subsequent to step 632, the process loops back to step 620 and the next program pulse is applied to the memory cells.

Figure 7A:
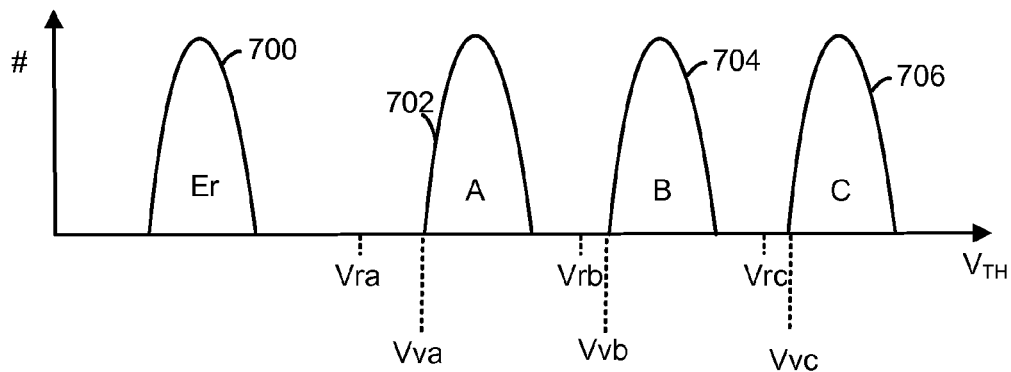
FIG. 7A depicts an example set of threshold voltage distributions for a four-state memory device in which each storage element stores two bits of data.

FIG. 7A depicts an example set of threshold voltage distributions for a four-state memory device in which each storage element stores two bits of data. A first threshold voltage (Vth) distribution 700 is provided for erased (Er-state) storage elements. Three Vth distributions 702, 704 and 706 represent programmed states A, B and C, respectively. In one embodiment, the threshold voltages in the Er-state are negative and the threshold voltages in the A, B and C distributions are positive. However, all or a part of the threshold distribution in the Er-state may be positive. Also, all or a part of the threshold distribution of the A-state may be negative (likewise for other data states).

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 7B:
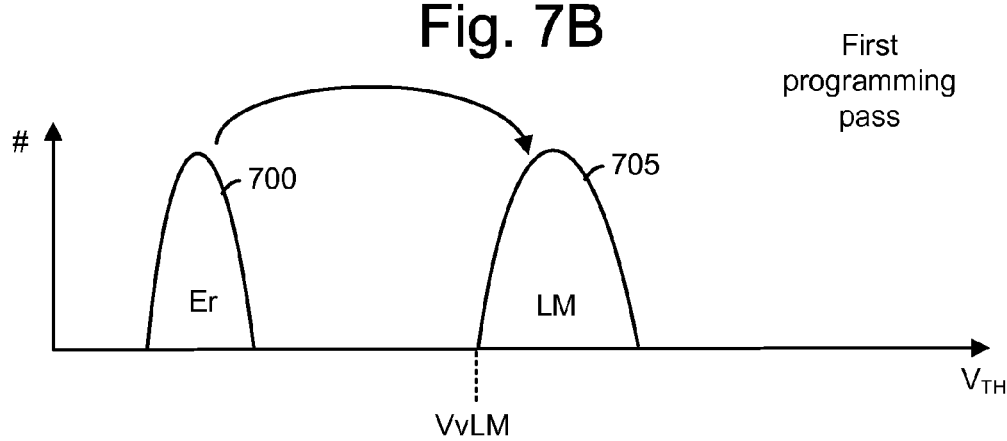
FIGS. 7B and 7C depict a two pass programming sequence in accordance with one embodiment.
Figure 7C:
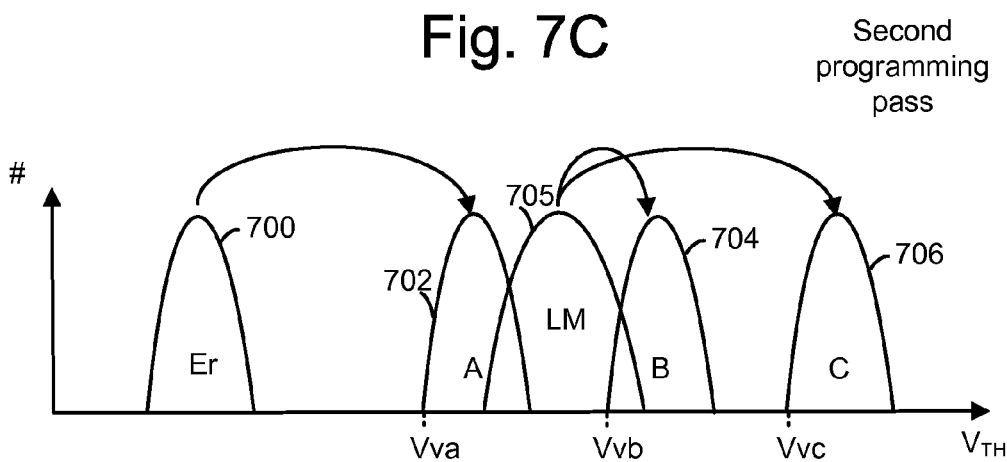

FIGS. 7B and 7C depict a two pass programming sequence in accordance with one embodiment. In the first pass, the lower page is programmed. In the second pass the upper page is programmed. As depicted in FIG. 7B, in the first pass storage elements intended for either the B- or C-states are programmed to an intermediate state 705. The intermediate state 705 has a verify level of VvLM.

As depicted in FIG. 7C, in the second pass programming to the A-, B-, and C-states is completed. Storage elements targeted for the A-state are programmed from the Er-state 700 to the A-state 702. Storage elements targeted for the B-state are programmed from the LM-state 705 to the B-state 704. Storage elements targeted for the c-state are programmed from the LM-state 705 to the C-state 706.

Note that sometimes, a substantial amount of time may pass between the first programming pass and the second programming pass. Also, in some embodiments, in order to perform the second programming pass, an internal data read is performed to determine whether memory cells are in the Er- of the LM-state. This, in effect, reads the lower data page. In one embodiment, a process determines whether the internal data read is adequate or whether error correction should be performed to correct misreads in order to program the upper page more accurately.

FIGS. 8A-8C depict one embodiment of a three pass programming sequence. The first pass depicted in FIG. 8A programs the lower page. Thus, in the first pass storage elements intended for either the B- or C-states are programmed to an intermediate state 705.

FIG. 8B depicts the second programing pass in which the B- and C-states are programmed. Storage elements targeted for the B-state are programmed from the LM-state 705 to the B-state 704. Storage elements targeted for the C-state are programmed from the LM-state 705 to the C-state 706. However, note that the A-state is not programmed during the second programming pass.

FIG. 8C depicts a third programming pass in which the A-state is programmed. Storage elements targeted for the A-state are programmed from the Er-state 700 to the A-state 702. Thus, note that the A-state programming is not started until the B- and C-states are complete.

A substantial amount of time may pass between the first programming pass (lower page) and the second (and third) programming passes. Also, in some embodiments, in order to perform the second and third programming passes, an internal data read is performed to determine whether memory cells are in the Er- of the LM-state. This, in effect, reads the lower data page. Embodiments include a process that determines whether the internal data read is adequate or whether error correction should be performed to correct misreads in order to program the upper page more accurately.

FIGS. 9A, 9B and 9C depict one embodiment of a three pass programming sequence in which the C-state is programmed prior to starting the other states. The first pass depicted in FIG. 9A programs the lower page. Thus, in the first pass storage elements intended for either the B- or C-states are programmed to an intermediate state 705. FIG. 9B depicts the C-state being programmed. Storage elements targeted for the C-state are programmed from the intermediate state 705 to the C-state 706.

FIG. 9C depicts the A- and B-states being programmed. Storage elements targeted for the A-state are programmed from the Er-state 700 to the A-state 702. Storage elements targeted for the B-state are programmed from the intermediate state 705 to the B-state 704.

A substantial amount of time may pass between the first programming pass (lower page) and the second (and third) programming passes of FIGS. 9A-9C. Also, in some embodiments, in order to perform the second and third programming passes, an internal data read is performed to determine whether memory cells are in the Er- of the LM-state. This, in effect, reads the lower data page. Embodiments include a process that determines whether the internal data read is adequate or whether error correction should be performed to correct misreads in order to program the upper page more accurately.

FIG. 10A depicts example threshold distributions to illustrate a potential for misreads that may occur. Curve 1002 and curve 1004 are two threshold distributions for two states immediately after programmed. Curve 1002 could be the Er-state and curve 1004 could be the LM-state. As another example, curve 1002 could be a "1" and curve 1004 a "0" for an SLC block. The assignment of "1" and "0" could be switched. In this example, there is actually some overlap between curves 1002, 1004 even immediately after programming. However, even if there is no overlap (and even if there is considerable margin), problems can still develop. Note that as memory devices continue to scale down in size, there may be a trend of less margin between states. Also, as a memory device undergoes additional program/erase cycles, the stress that the memory device undergoes can decrease the read margins.

Curve 1012 represents a shift in the threshold voltage of storage elements that were originally represented by curve 1002. Note that there is now considerable overlap between curve 1012 and curve 1004. One possible reason for the shift in threshold voltage of curve 1002 is read stress. For example, the act of reading the storage elements may shift the threshold voltages of at least some of the memory cells.

Note that curve 1004 may also shift, although to simplify discussion that shift is not depicted. Note that the shift could be downward, which could increase the amount of overlap. One factor for a downward shift is referred to as a data retention problem. In some cases, charge that is stored on the floating gate may leak, resulting in a change (e.g., lowering) of the threshold voltage. Also, factors such as temperature can increase problems such as data retention.

Note that one situation that may be especially problematic is referred to as an open block. This is where at least some of the word lines are only programmed with the lower page. If there is a long delay between programming the lower page and upper page, then the shift in the threshold voltages may become quite large.

Memory cells in the shaded region 1015 of distribution 1012 are those that should have been read as a "1" but were read as a "0". Note that in one embodiment no error correction is performed to attempt to correct for these misreads. Rather, this read of the IDL read level may be an "internal data load" in which memory cells are sensed and the result stored in a data latch on the memory die. However, the data (and associated ECC) are not sent off chip to a controller 244 to perform error correction to attempt to correct misreads.

FIG. 10B shows four threshold distributions after programming an upper page based on reading distribution 1012 and 1004 without attempting to correct misreads. Storage elements in distribution 1022 store a "1" for both the lower and upper page. Storage elements in distribution 1024 store a "1" for the lower page and a "0" for the lower page. Storage elements in distribution 1026 store a "0" for both the upper page and the lower page. Storage elements in distribution 1028 store a "0" for the lower page and a "1" for the upper page.

Distributions 1036 and 1038 represent storage elements that were mis-programmed. Distribution 1036 represents storage elements that should have been programmed to "10", but were mis-programmed to "00" because they were misread as previously discussed. Distribution 1038 represents storage elements that should have been programmed to "11", but were mis-programmed to "01" because they were misread as previously discussed.

The mis-programmed storage elements typically cannot be correctly read back by shifting read levels. For example, sometimes misreads can be corrected by simply shifting the read level. However, that typically will not work to correct these mis-programs.

Some error correction algorithms may be able to correct for at least some mis-programmed storage elements. For example, after applying error correction, a storage element that was mis-programmed to the "00" distribution may be correctly read as being at the "10" state. Likewise, after applying error correction, a storage element that was mis-programmed to the "01" distribution may be correctly read as being at the "11" state. However, there may be a limit as to how many mis-programmed storage elements can be corrected. The existence of those mis-programmed errors may also significantly impact capability of the controller to correct the normal errors caused by overlapping of two adjacent states. Also, not all error correction algorithms are able to correct such mis-programmed storage elements. An error that cannot be corrected by shifting read levels or by applying error correction may be referred to as a "hard error."

Another problem may occur when transferring data from an SLC block to an MLC block. An SLC block is a block of storage elements in which data is stored as one bit per storage element. An MLC block is one in which storage elements may store multiple bits. However, note that in an MLC block, it is possible to have some storage elements that store only a single bit, at least at some point in time.

In one embodiment, the controller 244 first writes data to a SLC block. Later, the controller 244 may issue a command instructing that the data in an SLC block be transferred (e.g., "folded") into an MLC block. This may involve reading the data from storage elements in an SLC block into data latches on the memory die without attempting to correct for misreads, if it is safe to do so. As one example, data from two different word lines in an SLC block are read to data latches 494. Then, a word line in an MLC block is programmed using the data from the data latches 494. Note that this does not always require that the data from the SLC block be sent to the controller 244 to attempt to correct for misreads. In one embodiment, a test is performed to determine whether the data should be sent to the controller 244 to correct for misreads.

Note that if there are misreads when transferring the data from the storage elements in the SLC block to the data latches, then the storage elements in the MLC blocks could be mis-programed. If the SLC block has some sort of a defect, has been through many program/erase cycles, or data has shifted since programming then there could be a substantial number of misreads. In some cases, a mis-programmed MLC block can be successfully read by applying error correction. This problem is somewhat similar to the previously discussed problem of programming the upper page of data based on reading the lower page without attempting to correct for misreads. By determining whether the data from the SLC block should be sent to the controller 244 to correct for misreads, hard errors are reduced or prevented.

Note that an MLC block could store three bits, four bits, or even more bits per storage element. Further details of transferring data from an SLC block to an MLC block are described in U.S. Published Patent Application 2010/0309719, titled "Folding Data Stored in Binary Format into Multi-State Format within Non-Volatile Memory Devices," by Yan Li, filed on Jun. 5, 2009, which is hereby incorporated by reference.

Figure 11A:
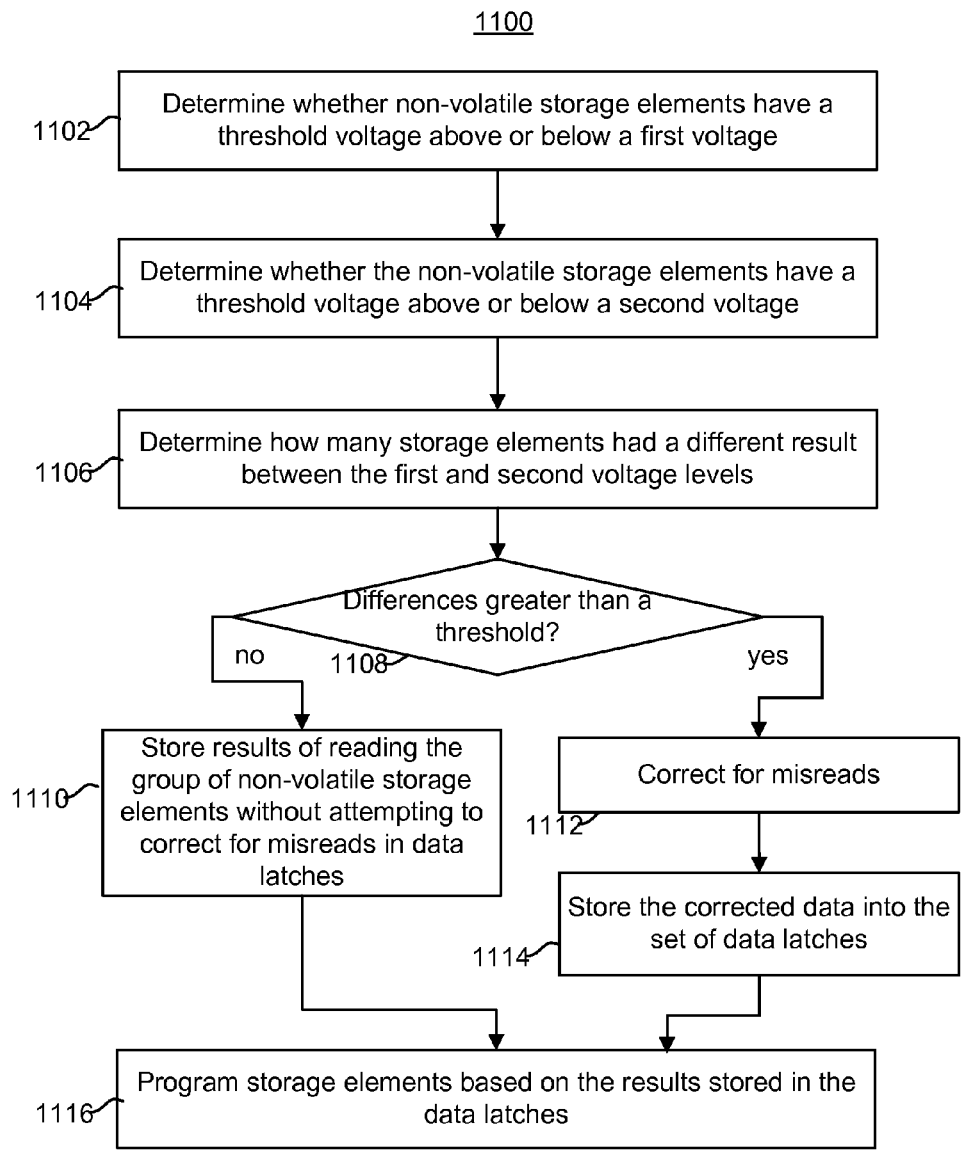
FIG. 11A is a flowchart of one embodiment of a process of determining whether an internal data load should be used or whether the read should be performed using ECC.

FIG. 11A is a flowchart of one embodiment of a process 1100 of determining whether an internal data load should be used or whether the data should be loaded with a read using ECC. In one embodiment, process 1100 is performed in response to a request to program an upper page of data into a group of storage elements that already have a lower page programmed. In one embodiment, process 1100 is performed in response to a request to transfer data from one or more SLC blocks to an MLC block.

Note that process 1100 describes a general flow and that the steps may be performed in a different order. Also, note that a step may comprise sub-steps. In some cases, after performing one or more sub-steps of one step, a different step or steps (or portions thereof) may be performed. Then, or more sub-steps of the first step may be performed.

In step 1102, a determination is made whether non-volatile storage elements in a group have a threshold voltage that is above or below a first voltage level. In one embodiment, step 1102 includes reading the group of non-volatile storage elements on a memory die 212 using a first read level. Note that this read does not require that error correction be used to attempt to correct misreads. In one embodiment, the group of non-volatile storage elements are associated with a word line.

In step 1104, a determination is made whether non-volatile storage elements in have a threshold voltage that is above or below a second voltage level. In one embodiment, step 1104 includes reading the group of non-volatile storage elements using a second read level. Note that this read does not require that error correction be used to attempt to correct misreads.

In one embodiment, after each read of steps 1102 and 1104, the results are stored in a set of data latches. These data latches may be in the data latches 494 in a sense block 300; however, data latches could be located elsewhere on the memory die 212. In general, the first and second reads read the same unit of data. This unit of data may be a lower page, but that is not necessarily always the case.

Figure 12A:
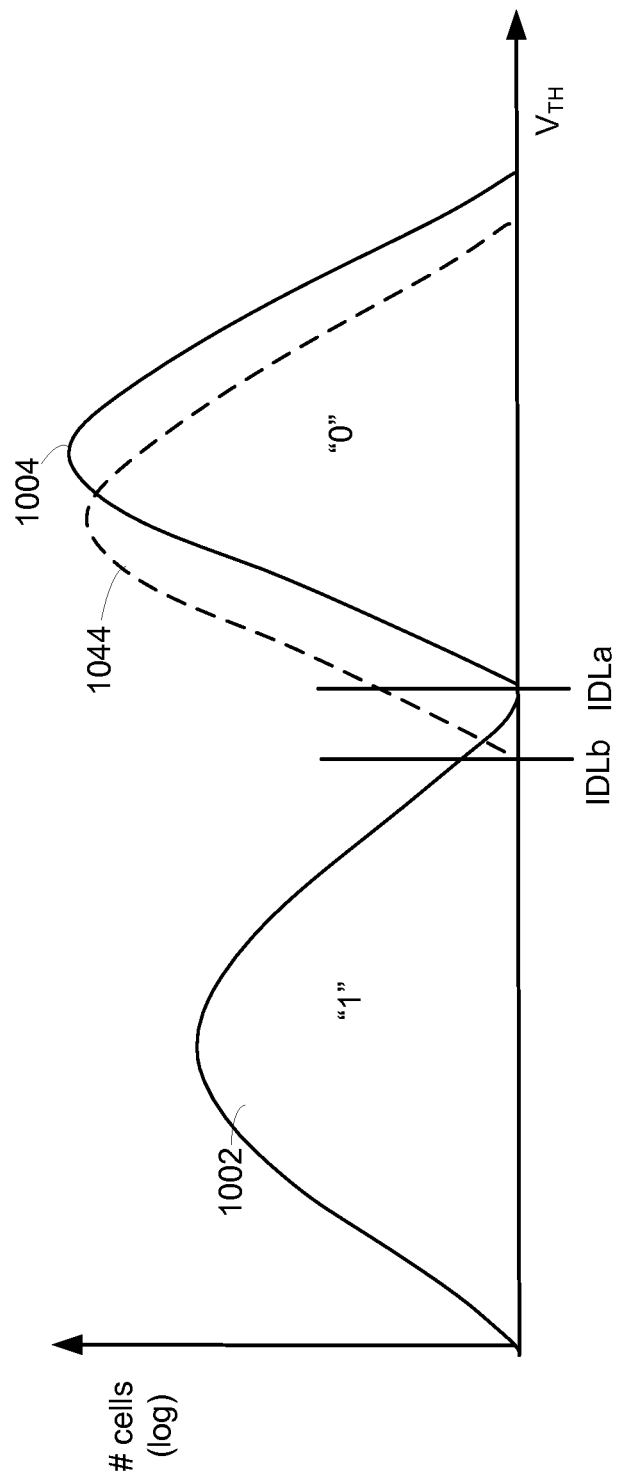
FIG. 12A shows several threshold voltage distributions to show example read levels during one embodiment of the process of FIG. 11A.

The reads may be at two different voltage levels. Reference will be made to read levels in FIG. 12A. FIG. 12A shows several threshold voltage distributions. Distributions 1002 and 1004 may be for those just after programming. Distribution 1044 represents a shift to distribution 1004 after programming. This shift may be due to a data retention problem. Note that distribution 1002 may also shift, but this is not depicted. Distributions 1002 and 1004 (or 1044) may correspond to an Er- and an LM distribution in an embodiment in which an upper page has been requested to be programmed. These also could correspond to a "1" and a "0" state in which a request has been made to transfer data from an SLC block to an MLC block. The two read levels are depicted as IDLa and IDLb.

The read of steps 1002 and 1004 does not need to perform error correction to attempt to correct misreads. This is in contrast to a read that may send the data and associated ECC to a controller 244 to use the ECC to attempt to correct misreads. Thus, note that the read of steps 1002 and 1004 may have some misreads that are not corrected by error correction.

In step 1006, a count is made of how many of the non-volatile storage elements in the group showed a different result between the first voltage level and the second voltage level. The count may be referred to herein as "mis-comparers." Note that a mis-compare does not mean that data has been misread. Referring again to FIG. 12A when a first read is performed at read level IDLa followed a second read at read level IDLb, it may be expected that some of the memory cells will have a different reading between the two reads. In effect, the number of memory cells having a threshold voltage between read level IDL1 and read level IDLb may be counted. Note that the shift of distribution 1004 to 1044 may increase the number of storage elements in this count.

In step 1108, a determination is made whether the count from step 1106 is greater than a threshold. In one embodiment, step 1108 determines whether the data can be read with sufficient accuracy without error correction. In one embodiment, it is determined whether the internal data read can be used or whether the data and ECC should be sent off chip for error correction. The threshold count "N" may be based on the memory device's ability to correct errors. The threshold count may be set as a default value. The threshold count can be changed as a parameter on the memory die. The threshold count could be a parameter for a specific word line, block, memory die, etc.

If step 1108 determined that the internal data read should be used, then results from an internal data load are stored in a set of data latches 494, in step 1110. Note that these results could from one of the reads already performed in step 1102 or 1104. Possibly an additional read could be performed. Note the storing the data in step 1110 does not require that error correction be used to correct misreads. Also, the data does not need to be sent off the memory die 212 to a controller 244, for example. For example, the results from sensing memory cells may be stored directly into the data latches 494, in one embodiment.

If step 1108 determined that the differences are greater than the threshold, then the group of non-volatile storage elements are read correcting for misreads, in step 1112. In one embodiment, the data read from the storage elements and associated ECC is sent to the controller 244. The controller 244 may use the ECC to attempt to correct any misreads. The controller 244 could dynamically adjust the read levels and re-read the storage elements of error correction using the ECC is unable to correct the misreads.

In step 1114, the corrected data is stored into the set of data latches. Thus, regardless of whether step 1110 or step 1114 is performed, the set of data latches 494 store the data that was to be read from the storage elements. In one embodiment, this is lower page data. In one embodiment, this is the data that was stored in the SLC block.

In step 1116, programming is performed based on the data stored in the set of data latches. In one embodiment, an upper page is programmed. This may be based on lower page data stored in step 1110. Note that the lower page was already programmed into the storage element in this embodiment. However, note that successfully programming the upper page for a given storage element may depend on whether the lower page for that storage element was a "1" or a "0". For example, referring to FIG. 7C, a storage element having an upper page bit of "1" could be targeted for either the Er-state or the C-state, depending on the value of its lower page bit. Thus, suitable identification of C-state cells may depend on knowing both the lower and upper page bits, in one embodiment. Similar reasoning applied to storage elements targeted for other states.

In one embodiment of step 1116, the data in the latches is used for programming storage elements in an MLC block. Process 1100 could be performed more than once to store two or more pages of data into data latches in an SLC block. For example, the first time process 1100 could be used to read storage elements on one word line in an SLC block. Next, process 1100 could be used to read storage elements on another word line in the SLC block. The net result is that two pages are stored in the data latches. Then, these two pages may be programmed onto a single word line in a MLC block. Note that storage elements can be programmed to three or more bits per. In this case, more than two pages may be transferred from the SLC block to a word line in the MLC block.

Figure 12B:
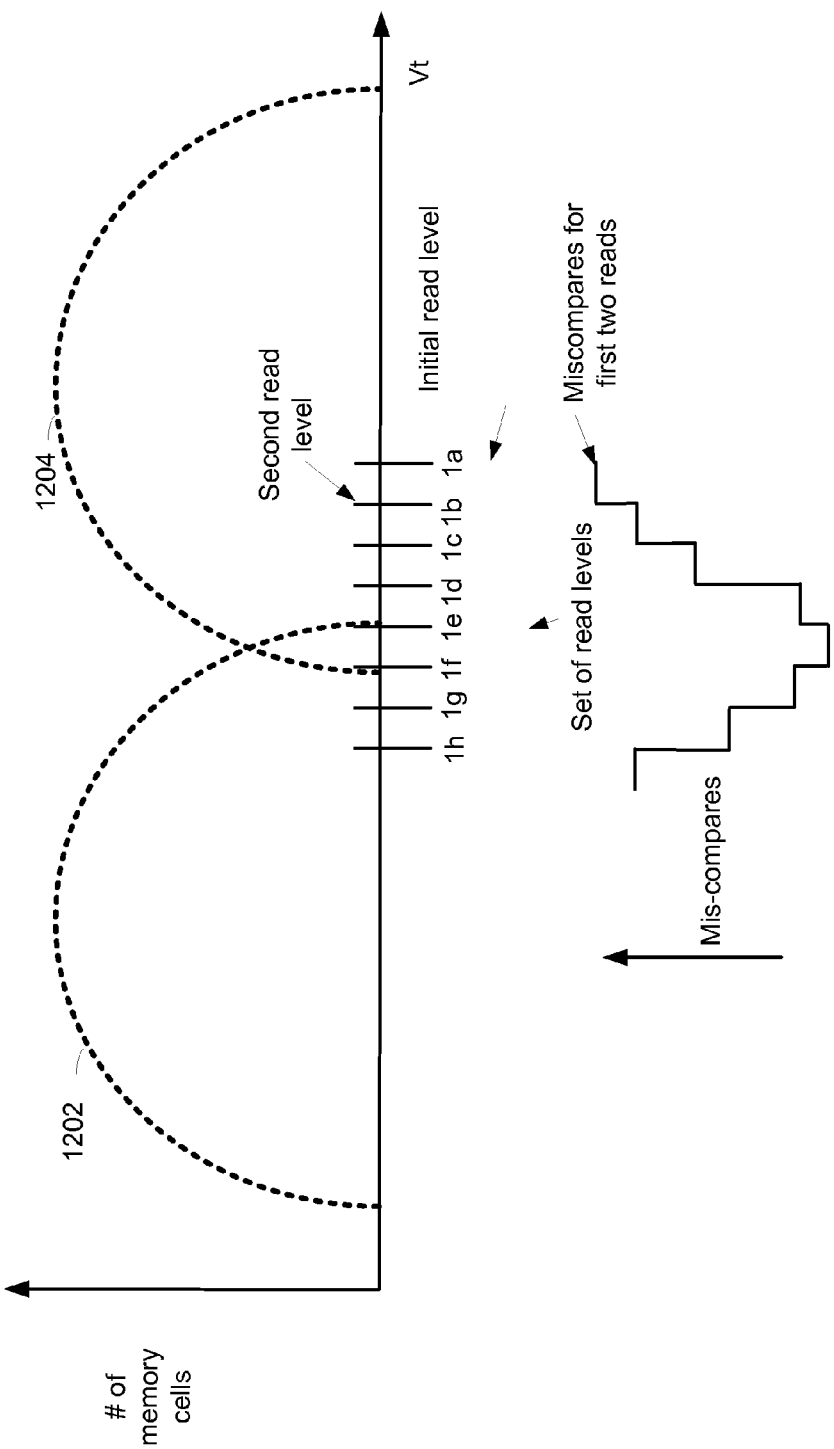
FIG. 12B shows threshold voltage distributions, example read levels, and example mis-compares during one embodiment of the process of FIG. 11A.

Note that steps 1102-1106 may be performed more than once, such that reading is performed at additional read levels. FIG. 12B shows a series of read levels 1a-1h, which for the purpose of discussion have an initial read level 1a on the right and successive read levels moving to the left. The order could be switched to move from left to right (or from lower to higher voltages). FIG. 12B shows two threshold voltage distributions 1202, 1204. Distribution 1202 could correspond to the Er-state and distribution 1204 could correspond to the LM state, as one example. Distribution 1202 could correspond to a "1" state and distribution 1204 could correspond to a "0" state, as another example.

In one embodiment, the first time step 1106 is performed it is for reads performed at levels 1a and 1b. The next time step 1106 is performed, it is for reads at levels 1b and 1c, and so on. In one embodiment of step 1006, a count of how many of the non-volatile storage elements showed different results between the two most recent of the successive reads is determined. For example, referring again to FIG. 12B, a mis-compare count is depicted below each pair of neighbor read levels. The mis-compare count for the first two read levels 1a, 1b is determined by comparing the results of the initial read level 1a and the second read level 1b. Each memory cell that shows a different result between the initial read and the second read is considered to be a mis-compare. The mis-compare count can be quite high between the initial read level and the second read level. In this example, the mis-compare count drops as the read levels approach the intersection of the two curves. The mis-compare count may be lowest at about the valley between the threshold voltage distributions. If reading were to be continued beyond this point (e.g., to still lower voltages), then the mis-compare count may go up, as indicated in FIG. 12B. However, it is not required to perform all of these reads. In one embodiment, each successive read may be at a lower voltage. In one embodiment, each successive read may be a higher voltage.

The set of read reference levels may be near an expected read level for distinguishing between two data states. The space between two adjacent read levels may be referred to as a "zone". The zones can be selected with positive and negative shifts around a default read level. The size of the zones may be chosen based on factors such as how much margin is between the states, and how the threshold distribution slope changes with read levels. The number of zones can depend on desired accuracy, as well as performance penalty that is permitted.

Figure 11B:
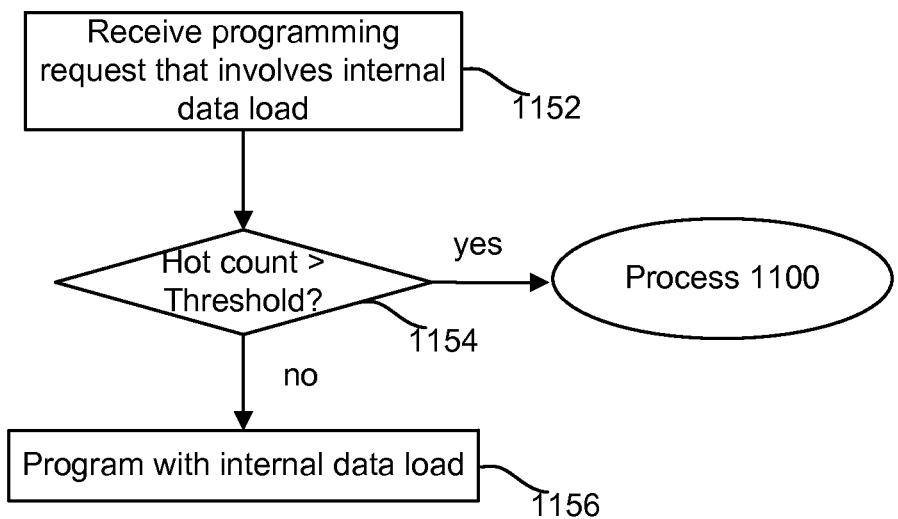
FIG. 11B is a flowchart of one embodiment of a process of determining whether to perform the process of FIG. 11A based on a hot count.

In one embodiment, process 1100 is performed dependent upon the number of program/erase cycles for the block. FIG. 11B is a flowchart of one embodiment of a process 1150 of determining whether to perform process 1100. In step 1152, a request is received to perform a programming operation that involves an internal data load. An internal data load is one in which at least some of the data to be used in the programming operation is read from storage elements on the memory die. This is in contrast to the memory die receiving all of the data externally. Two examples in which an internal data load may be used have been provided. One is programming an upper page when the lower page has already been programmed (lower page may be read internally). Another is transferring data from an SLC block to an MLC block (all data may be read internally).

In step 1154, a determination is made whether a "hot count" is greater than a threshold. The hot count is the number of program/erase cycles for the block. The hot count may be stored in non-volatile storage in the block, elsewhere on the memory die containing the block, or even outside of the memory die.

If the hot count is greater than the threshold (step 1154=yes), then process 1100 is performed. If the hot count is not greater than the threshold (step 1154=no), then the program operation is performed using an internal data load without checking to determine whether misreads should be corrected. For example, if the program operation is to program an upper page, then the lower page is read directly from the storage elements to data latches on the memory die without performing a process such as process 1100 to determine whether misreads should be corrected.

Figure 13:
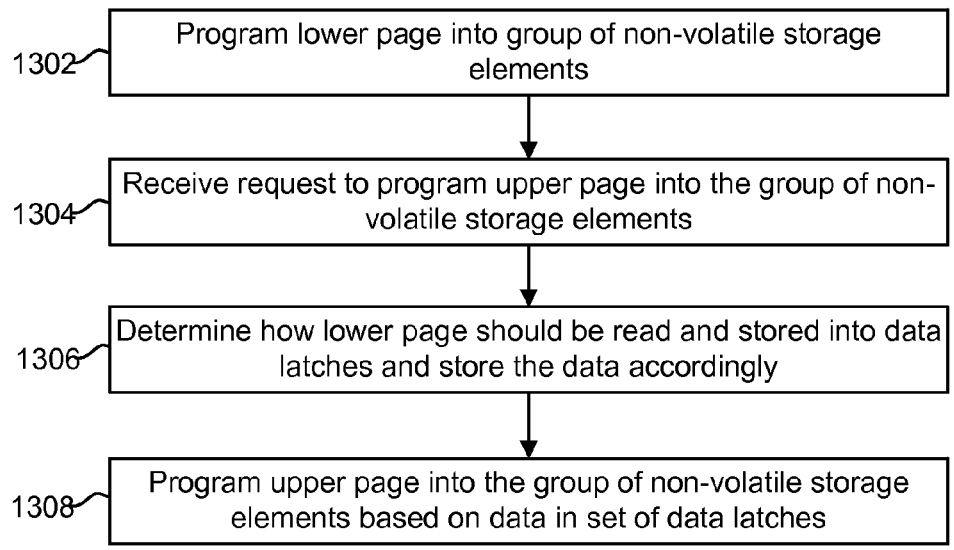
FIG. 13 is a flowchart illustrating a process of programming an upper page of data.

FIG. 13 is a flowchart illustrating a process 1300 of programming an upper page of data. In step 1302, a lower page of data is programmed into a group of non-volatile storage elements. Referring to FIG. 7B (or FIG. 8A or FIG. 9A), in some embodiments, lower page programming includes programming selected memory cells from the Er-state 700 to the LM-state 705.

In step 1304, a request is received to program an upper page of data into the group of non-volatile storage elements. This request might be received very soon after the lower page was programmed, or at any time later. In some cases, blocks are not completely programmed, thus leaving some word lines with only lower pages programmed. In one embodiment, the controller 244 requests that a managing circuit on the memory die program the upper page of data. This request may include the controller 244 providing the upper page of data, which may be stored into data latches 494 on the memory die. This request is for the managing circuit to use the lower page of data that was already programmed into the storage elements, as needed to correctly program the upper page.

In step 1306, a determination is made as to how the lower page data should be read from the storage elements. For example, it is determined whether the lower page data can be transferred directly from the storage elements to data latches 494 without correcting any possible misreads, or to transfer the lower page data to the controller 244 to correct misreads. In one embodiment, a determination is made as whether or not an internal data load should be used. Also, in step 1306, the data is stored into data latches 494 accordingly. The process of FIG. 11A may be used to implement step 1306.

In step 1308, an upper page of data is programmed based on the lower page data that was stored in the data latches in step 1306. In one embodiment, programming the upper page includes performing the second programming pass depicted in FIG. 7C. In one embodiment, programming the upper page includes performing the second programming pass depicted in FIG. 8B and the third programming pass depicted in FIG. 8C. In one embodiment, programming the upper page includes performing the second programming pass depicted in FIG. 9B and the third programming pass depicted in FIG. 9C. Step 1308 is one embodiment of step 1116 from FIG. 11A.

Figure 14:
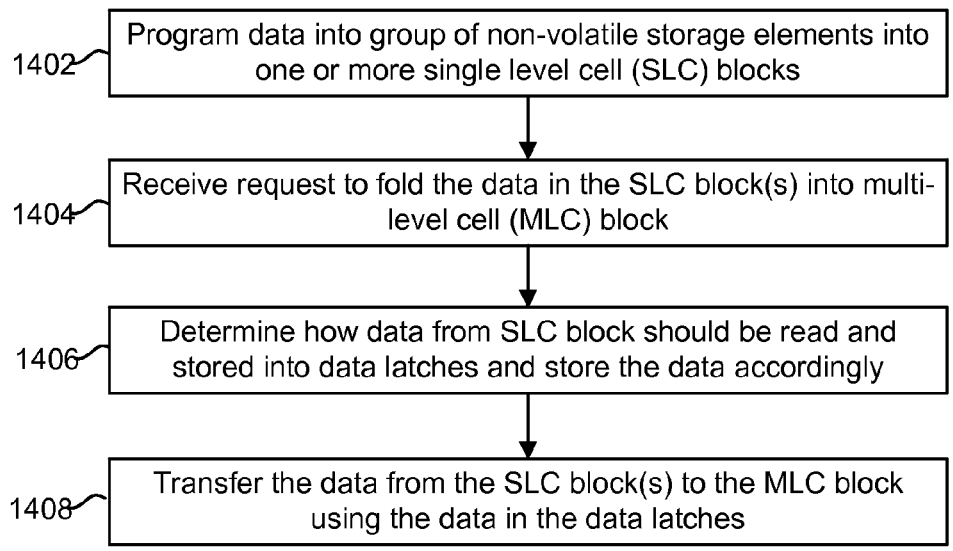
FIG. 14 is a flowchart illustrating a process of transferring data from one or more SLC blocks to an MLC block.

FIG. 14 is a flowchart illustrating a process 1400 of transferring data from one or more SLC blocks to an MLC block. In step 1402, data is programmed into a group of non-volatile storage elements in an SLC block. In one embodiment, the controller 244 provides the data, as well as ECC to be programmed into a word line of the SLC block. The ECC may be calculated under the assumption that the data will eventually be stored in an MLC block.

In step 1404, a request is received to transfer data from the group of non-volatile storage elements in the SLC block to an MLC block. This request might be received very soon after the SLC block was programmed, or at any time later. In one embodiment, the controller 244 sends the request to a managing circuit on a memory die containing the SLC and MLC block. The request may be for the managing circuit to attempt to use the SLC data without correcting for misreads. Thus, the managing circuit may attempt to avoid sending the SLC data to the controller 244 to correct misreads, if this would not cause too many mis-programs of the MLC block.

In step 1406, a determination is made as to how the data from the SLC block should be read. In one embodiment, a determination is made as whether an internal data load should be used. Also, in step 1406, the data from the group of storage elements in the SLC block is stored into data latches 494 accordingly.

In step 1408, data is transferred from the SLC block to an MLC block using the data that was stored in the data latches in step 1406. The process of FIG. 11A may be used to implement steps 1406-1408. Step 1408 is one embodiment of step 1116.

Figure 15A:
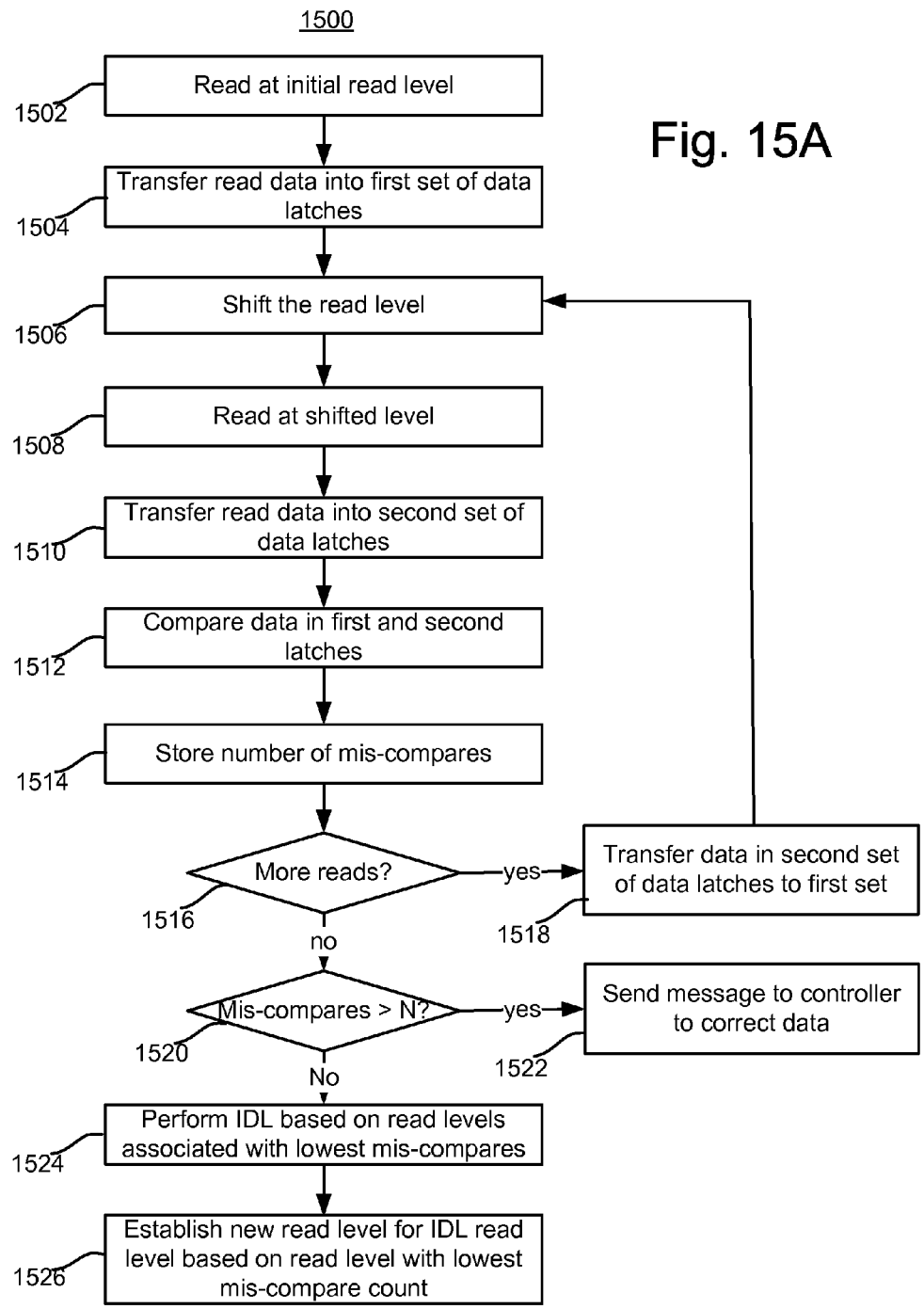
FIG. 15A is a flowchart of one embodiment of a process of determining how to read storage elements and also establishing a new internal data load read level.

FIG. 15A is a flowchart of one embodiment of a process 1500 of determining whether to use an internal data load and also establishing a new IDL read level. Process 1500 shows further details of one embodiment of process 1100. Process 1500 also includes a step of establishing a new IDL read level. Process 1500 could be used in connection with programming an upper page when a lower page is already programmed. Process 1500 could be used in connection with transferred data from an SLC block to an MLC block.

In step 1502, reading non-volatile storage at an initial read level is performed. The initial read level may be the level that was most recently determined using process 1500 or another process. It could also be a default level that was set at the factory. As one example, a read at level 1a (see FIG. 12B) is performed.

In step 1504, results from the initial read are transferred to a first set of data latches. There may be one data latch in the first set for each memory cell that is read. The data latches are on the memory die 212 in one embodiment. An example is the data latches 494 in the sense block 300. Note that it is not required to perform an error correction on the data prior to storing it in the data latches.

In step 1506, the read level is shifted. The read level may be shifted down or up. As one example, the read level is shifted down to level 1b (see FIG. 12B). Note that step 1506 may be repeated several times during process 1500. In one embodiment, the read level is shifted by the same amount each time. For example, the read level might be shifted by 50 mV each time. However, the magnitude of the voltage shift could be different from one iteration of step 1506 to the next.

In one embodiment, the amount of shift is a function of the mis-compare count. For example, the shift may be large when the mis-compare count is high, and as the mis-compare count reduces, the shift in read level is also reduced. The mis-compare count may suggest how far the read level is from the valley between two threshold voltage distributions. When the mis-compares are high, it is likely that the read level is away from the valley position, which means a larger shift can be made during the next iteration, without skipping over the valley position.

In step 1508, the memory cells are read at the new read level. In step 1510, results of the read of step 1508 are transferred to a second set of data latches. In one embodiment, these latches are on the memory die 212. As one example, the data latches are in data latches 494 in sense block 300. Note that it is not required to perform an error correction on the data prior to storing it in the data latches.

Figure 16:
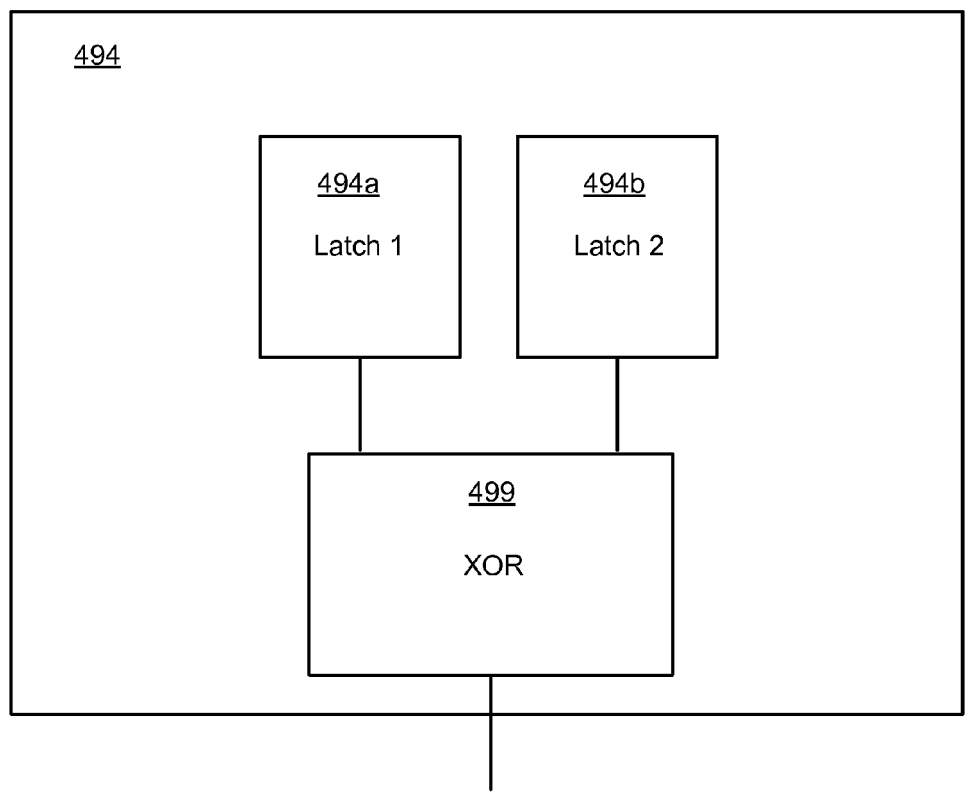
FIG. 16 is a diagram illustrating data latches and an XOR circuit of one embodiment.

In step 1512, the results in the first and second sets of data latches are compared. In one embodiment, an XOR logic operation is performed between the first and second data latches, on a memory cell by memory cell basis. Therefore, if the read results for a given memory cell were the same for the two reads, then the comparison produces a "0," in this embodiment. However, if the read results for a given memory cell were different for the two reads, then the comparison produces a "1," in this embodiment. A comparison result of "1" may be referred to herein as a "mis-compare." FIG. 16 depicts one embodiment of latches 494 having a Latch 1 494a, Latch 2 494b, and an XOR circuit 499 for determining the exclusive OR between the results in the two latches 494a, 494b. The XOR circuit may output a mis-compare result. There may be one such set of latches 494a, 494b for each memory cell being read.

In step 1514, the number of mis-compares for the memory cells being read are stored. These may be stored on the memory die 212. In step 1516, a determination is made whether more reads are to be performed. In one embodiment, only two reads are performed. In one embodiment, a series of reads will be performed at preset read levels as shown in FIG. 12B. The reads with minimum mis-compares are found afterwards. In one embodiment, additional reads are performed as long as the count is decreasing. However, upon the count increasing no more additional reads are performed. Other criteria could be used to determine how many reads to perform.

When there are no more reads to performed (step 1516=no), then the lowest number of mis-compares that was found are compared to a threshold number. In one embodiment, the threshold number is based on how many mis-programs would occur if the uncorrected lower page data from the internal data load were to be used when programming the upper page (or the MLC block). A mis-program here is defined a programming a memory cell to the wrong state because of a misread of the lower page of data, as has been previously discussed. Therefore, the threshold number may also be based on how many misreads would occur if the lower page data is not corrected.

If the mis-compares are greater than the threshold, this may indicate that the lower page data should not be read using an internal data load. For example, the lower page data should be read using error correction to correct misreads. In this case, a message may be sent to the controller 244 in step 1522 to correct the data. Further details of a controller 244 correcting misreads are discussed below.

When there are more reads to performed (step 1516=yes), then process 1500 may return to step 1506 to shift the read level. Also, in step 1518, the results stored in the second set of data latches (e.g., 494b) may be transferred to the first set of data latches (e.g., 494a). Thus, when the next read is performed, the second set of data latches 494b is free to store the latest read results. In one embodiment, rather than actually transferring results from the second set of data latches 494b to the first set of data latches 494a in step 1518, the roles of the data latches are reversed. For example, the next read results may be stored in the first set of data latches (rather than the second set as indicated in step 1510).

If step 1520 indicates that the number of mis-compares is not greater than the threshold (step 1520=no) this may indicate that the most recent read level was suitable to read the memory cells, and to use the data from the internal data load when programming upper page data (or MLC block). Note that the threshold number in step 1520 may be set at a lower level than a borderline case for correcting errors. Note that the number of mis-compares, in general, is not the same as the number of misreads. However, in some embodiments, there is a relationship or correlation between the number of mis-compares and the number of misreads.

In step 1524, an internal data load is performed based on a read level associated with the lowest number of mis-compares. In one embodiment, another read dies not need to be performed at this time, as the data already stored in either the first or second latches might be used. Alternatively, in some cases, the results in the first and second latches may not represent a read at the best level. For example, referring to FIG. 12B, a read level at about level 1e or 1f might be preferred, as those levels are near the valley of the intersection of distributions 1202 and 1204. However, it may be that the last reads were at levels 1g and 1h. In this case, the lowest mis-compare should be associated with the pair of reads at 1e and 1f. Therefore, another read can be performed at a level that near 1e or 1f for the internal data load. The read for the internal data load could be exactly one of those levels, somewhere between those two levels, or even somewhat higher than 1e, or somewhat lower than 1f.

Note that a read level associated with the lowest number of mis-compares may be stored for later use. This is indicated by step 1526 of establishing a new read level for internal data load. The final read level may be stored in one of the temporary registers on the memory, or else it may be stored externally in the controller's non-volatile memory. This new read level for IDL could be for any unit of storage elements (word line, block, memory die, memory device). Note that the internal data load read level may be determined without sending read results off the memory die 212. For example, there is no need to send the read results to an external controller to perform complex calculations. Moreover, the internal data load read level may be found without applying ECC corrections to the results.

FIG. 15B is a flowchart of one embodiment of a process 1550 of determining whether to use an internal data load. Process 1550 shows further details of one embodiment of process 1100. Process 1550 could be used in connection with programming an upper page when a lower page is already programmed. Process 1550 could be used in connection with transferred data from an SLC block to an MLC block.

In step 1552, reading non-volatile storage at a first read level is performed. As one example, a read at level IDLa (see FIG. 12A) is performed.

In step 1554, results from the first read are transferred to a first set of data latches (e.g., 494a). There may be one data latch in the first set for each memory cell that is read. The data latches are on the memory die 212 in one embodiment. An example is the data latches 494 in the sense block 300. Note that it is not required to perform an error correction on the data prior to storing it in the data latches.

In step 1556, the memory cells are read at a second read level. In step 1558, results of the read of step 1556 are transferred to a second set of data latches (e.g., 494b). In one embodiment, these latches are on the memory die 212. As one example, the data latches are in data latches 494 in sense block 300. Note that it is not required to perform an error correction on the data prior to storing it in the data latches.

In step 1560, the results in the first and second sets of data latches are compared. In one embodiment, an XOR logic operation is performed between the first and second data latches, on a memory cell by memory cell basis. Therefore, if the read results for a given memory cell were the same for the two reads, then the comparison produces a "0," in this embodiment. However, if the read results for a given memory cell were different for the two reads, then the comparison produces a "1," in this embodiment.

In step 1562, the number of mis-compares that was found is compared to a threshold number ("N"). In one embodiment, the threshold number is based on how many mis-programs would occur if the uncorrected lower page data from the internal data load were to be used when programming the upper page (or the MLC block). The threshold number may also be based on how many misreads would occur if the lower page data is not corrected.

If the mis-compares are greater than the threshold, this may indicate that the data should not be read using the internal data load. In other words, the data should be read using error correction to correct misreads. In this case, a message may be sent to the controller 244 in step 1564 to correct the data.

If step 1562 indicates that the number of mis-compares is not greater than the threshold (step 1562=no) this may indicate that at least one of the reads was suitable to read the memory cells, and to use that data when programming upper page data (or MLC block). Note that the threshold number is step 1562 may be set at a lower level than a borderline case for correcting errors. Note that the number of mis-compares, in general, is not the same as the number of misreads. However, in some embodiments, there is a relationship or correlation between the number of mis-compares and the number of misreads.

In step 1566, the results in either the first or second set of latches may be used for the internal data load. Note that an alternative is to perform an additional read at some other level and store this in either the first or second set of latches, as the internal data load. For example, a read could be performed at a level somewhere between IDLa and IDLb. In one embodiment, step 1566 includes programming based on the data in either the first or second sets of data latches.

FIG. 17A depicts a graph of fail bit count (or misreads) if reading a pair of over-lapping threshold distributions, without performing error correction. For example, the distributions of FIG. 10 have a "1" and a "0" threshold distribution that partially overlap. FIG. 17A shows curve 1702, which represents misreads corresponding to a memory cell that stored a "1", but was read as a "0." FIG. 17A shows curve 1704, which represents misreads corresponding to a memory cell that stored a "0", but was read as a "1." The "1" to "0" misreads are highest for low read voltage levels and then drop off. On the other hand, the "0" to "1" misreads are lowest at low read levels and then increase.

Figure 17B:
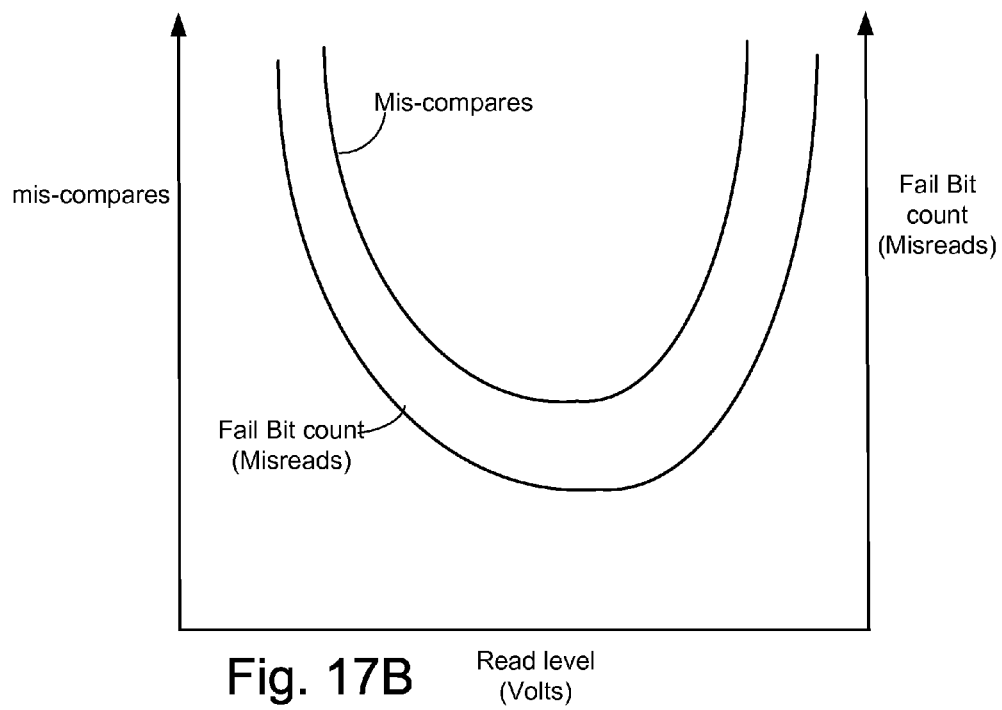
FIG. 17B depicts a graph of a possible relationship between mis-compares and misreads (also referred to as fail bit count) for one embodiment.

FIG. 17B depicts a graph of a possible relationship between mis-compares and misreads (also referred to as fail bit count) for one embodiment. The mis-compares and misreads are plotted versus read voltage level. The misreads are total misreads for a given read voltage level. For example, the misreads may be the total of the "1" to "0" misreads plus the "0" to "1" misreads.

The mis-compares may be the mis-compares from process 1100, process 1500, or process 1550 as examples. The read level for a mis-compare point may be the most recent read level that was used, among the pair of read levels for which the mis-compare count was determined. The scale for the mis-compares is in arbitrary units. Likewise, the scale for the misreads is in arbitrary units.

Figure 17C:
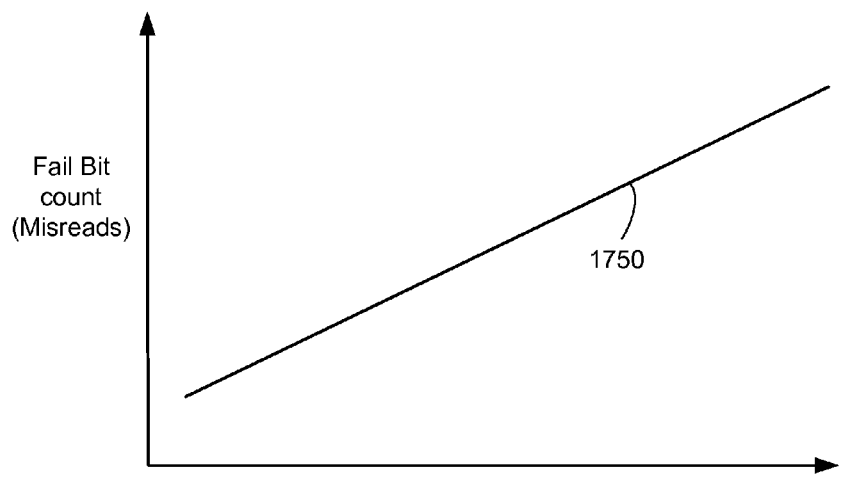
FIG. 17C depicts a graph indicating a correlation between misreads and mis-compares for one embodiment.

In general, mis-compares may correlate to misreads in the graph of FIG. 17B. FIG. 17C depicts a graph indicating a correlation 1750 between misreads and mis-compares for one embodiment. Note that if the threshold number of mis-compares is set to some specific number (e.g., 20), then this may correlate to a certain number of misreads. Therefore, the threshold number of mis-compares may be set to correlate to some tolerable number of misreads. Referring back to FIGS. 10A and 10B, a misread of the threshold distributions 1002, 1004 may lead to some memory cells being mis-programmed. Thus, the number of mis-programmed memory cells that are tolerable may be factored in to the determination of a suitable value for the threshold number of mis-compares.

Figure 18:
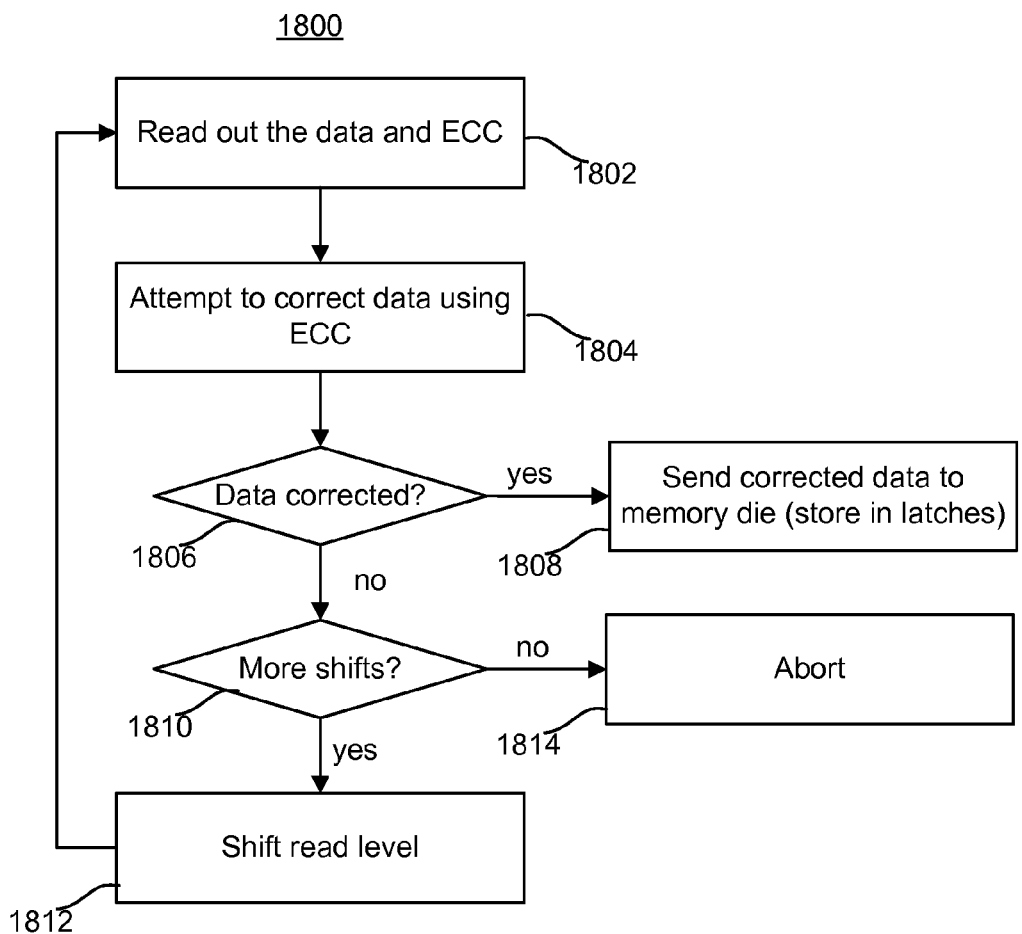
FIG. 18 is a flowchart of one embodiment of a process of a controller correcting misreads.

FIG. 18 is a flowchart of one embodiment of a process 1800 of a controller 244 correcting misreads. Process 1800 may be performed in response to a managing circuit on a memory die determining that a unit of data stored in storage elements should be read using error correction. Process 1800 is one embodiment of step 1112 of FIG. 11A. Process 1800 could be performed in response to the message sent to the controller 244 in step 1522 or step 1564.

In step 1802, data is read out from the memory die 212 to the controller 244. Error correction codes that were stored in association with the data is also read out from storage elements and transferred to the controller 244. In one embodiment, data stored in storage elements associated with one word line is read out to the controller 244. The ECC may be stored on the same word line as the unit of data. The unit of data may be a page (e.g., lower page). However, the unit of data is not required to be a page. The unit of data might not be a page in the event that data is being read from an SLC block.

In step 1804, the controller 244 attempts to correct any misreads using the ECC. If the data can be corrected (step 1806=yes), then the corrected data is transferred to the memory die 212, in step 1808. The corrected data may be stored into data latches 494 on the memory die.

If the data is not correctable using ECC, then a determination is made whether additional shifts to the read level are warranted. Shifting the read level can help reduce or prevent misreads. If an additional shift is warranted (step 1810=yes), then the read level is shifted in step 1812. The process 1800 then returns to step 1802 to once again read out the unit of data and its associated ECC. If the data cannot be corrected even with shifting the read levels (step 1810=no), then the process 1800 ends with aborting the operation in step 1814.

Figure 19:
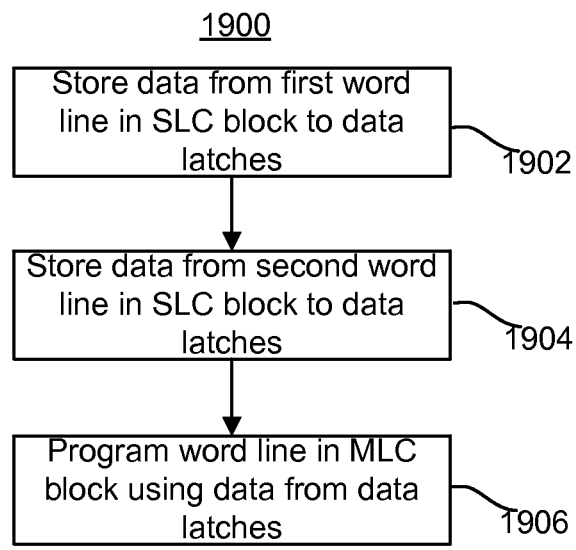
FIG. 19 is a flowchart of one embodiment of a process of transferring data from an SLC block to an MLC block.

FIG. 19 is a flowchart of one embodiment of a process 1900 of transferring data from an SLC block to an MLC block. Process 1900 may be performed in response to a request from the controller 244 to transfer the data. In step 1902, data from a first word line in the SLC block is stored in data latches in the SLC block. This data may include both a unit of data that was programmed into the word line and associated ECC (error codes). Selected steps from process 1100 (e.g., 1102-1108 and either 1110 or 1112-1114) may be used. Selected steps from either process 1500 or 1550 may be used.

In step 1904, data from a second word line in the SLC block is stored in other data latches in the SLC block. This data may include both a unit of data that was programmed into the word line and associated ECC (error codes). Selected steps from process 1100 (e.g., 1102-1108 and either 1110 or 1112-1114) may be used. Selected steps from either process 1500 or 1550 may be used.

In step 1906, a word line in an MLC block is programmed using the data that was stored in the latches in steps 1902 and 1904.

Figure 20:
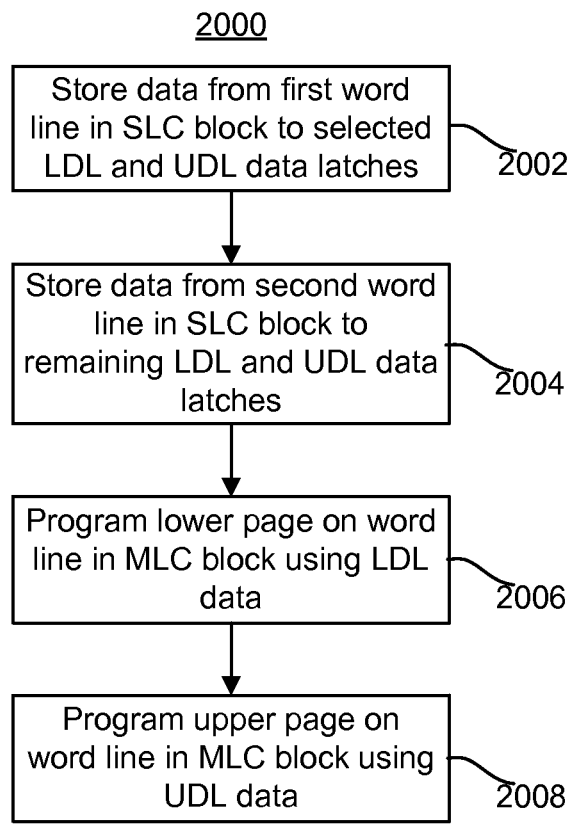
FIG. 20 is a flowchart of one embodiment of a process of folding data from an SLC block to an MLC block.

FIG. 20 is a flowchart of one embodiment of a process 200 of folding data from an SLC block to an MLC block. Process 2000 may be performed in response to a request from the controller 244 to transfer the data. In step 2002, data from a first word line in the SLC block is stored in selected LDL and UDL data latches in the SLC block. An LDL latch is one that is typically used to store lower page data. A UDL latch is one that is typically used to store upper page data. There may be one LDL latch and one UDL latch associated with each bit line. This data stored in this step may include both a unit of data that was programmed into the word line and associated ECC (error codes). Selected steps from process 1100 (e.g., 1102-1108 and either 1110 or 1112-1114) may be used in step 2002. Selected steps from either process 1500 or 1550 may be used in step 2002.

In step 2004, data from a second word line in the SLC block is stored in the other LDL and UDL latches in the SLC block. Note that after step 2004, the LDL latches store a lower page of data, and the UDL latches store an upper page of data. This data stored in this step may include both a unit of data that was programmed into the word line and associated ECC (error codes). Thus, some of the LDL and UDL latches may store ECC. Selected steps from process 1100 (e.g., 1102-1108 and either 1110 or 1112-1114) may be used. Selected steps from either process 1500 or 1550 may be used.

In step 2006, a lower page in an MLC block is programmed using the data that was stored in the LDL latches in steps 2002 and 2004. Step 2006 includes storing ECC for the lower page, in one embodiment.

In step 2008, an upper page in an MLC block is programmed using the data that was stored in the UDL latches in steps 2002 and 2004. Step 2008 includes storing ECC for the upper page, in one embodiment.

Note that the ECC that was originally stored in the SLC word line when it was programmed (prior to process 2000) may be suitable for use when the data is transferred to the MLC block. Thus, note that the controller 244 does not need to calculate new ECC when the data is folded from the SLC block to the MLC block.

Figure 21:
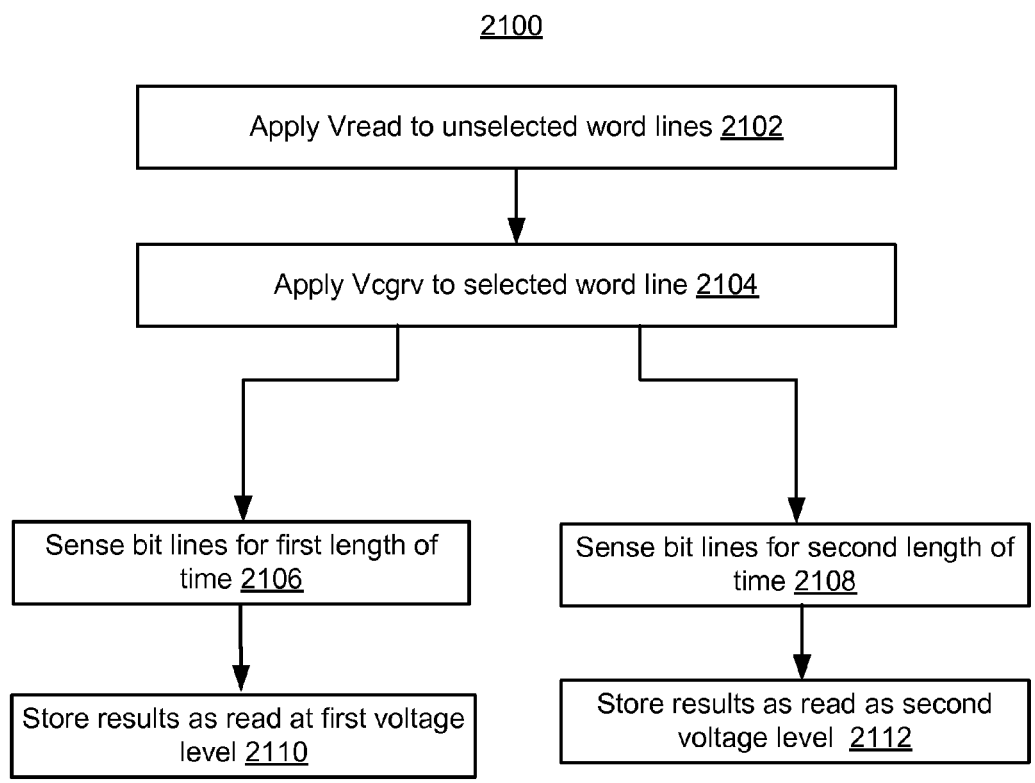
FIG. 21 is a flowchart of one embodiment of a process of sensing two different threshold voltages using a single word line voltage.

FIG. 21 is a flowchart of one embodiment of a process 2100 of sensing two different threshold voltages using a single word line voltage. This may be used when reading at a first and a second read level. In step 2102, a read pass voltage Vread is applied to unselected word lines. The read pass voltage may be sufficiently high to cause a memory cell to conduct regardless of its data state.

In step 2104, a read compare voltage Vcgrv is applied to a selected word line. The read compare voltage is typically close to the threshold voltage(s) that are being tested for in process 2100. Note that applying the read compare voltage may cause a selected memory cell on a given NAND string to conduct. Moreover, the magnitude of the conduction current may be a function of the memory cell's threshold voltage. If the memory cell's threshold voltage is below the read compare voltage, then the memory cell may have a conduction current.

In step 2106, bit lines are sensed for a first length of time. In one embodiment, a capacitor that is coupled to a given bit line is charged prior to step 2106. Then, in step 2106, the capacitor is discharged by the conduction current (if any). If the conduction current is strong enough, then the capacitor voltage will drop to a level that indicates that the memory cell turned on (e.g., conducted a current).

Note that the longer time for which the capacitor is discharged ("sense time"), the further the capacitor voltage is expected to fall for the same conduction current. Therefore, the sense time may be selected to adjust for what threshold voltage is being sensed. In one embodiment, sensing with shorter sense time means the memory cell must have higher conduction current through the NAND string to be detected as being "on", which means its Vt needs to be lower than what it needs to be if the sensing were done with a longer sense time.

In step 2108, bit lines are sensed for a second length of time. For example, the bit lines are sensed for a longer time in step 2108, which may test for a higher Vt than step 2108. Step 2108 may involve sensing the same sense capacitor as step 2106. Alternatively, two different sense capacitors may be used. In this case, a replica of the bit line current might be provided to the second capacitor.

In step 2110, the results from the first sense time are stored. In step 2112, results from the second sense time are stored. Since the first sense time is shorter, it may test for a lower threshold voltage.

Figure 22:
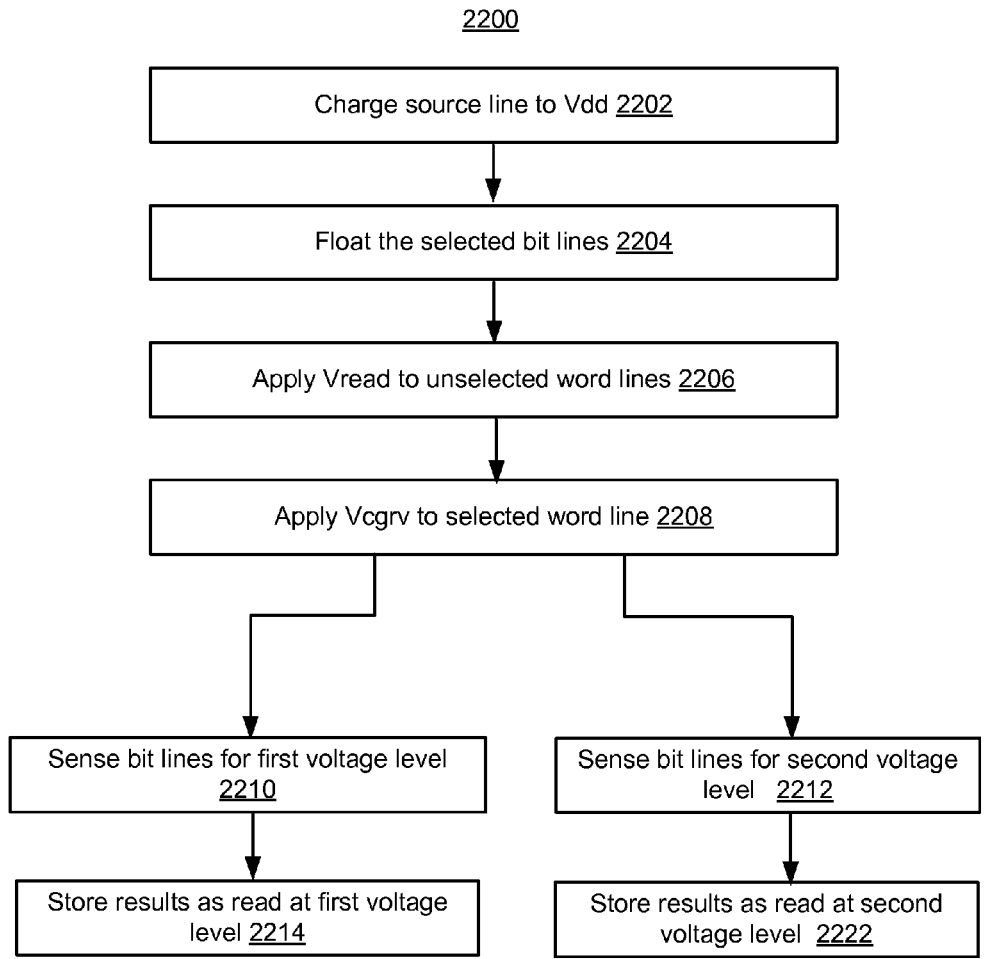
FIG. 22 is a flowchart of one embodiment of a process of reading using source-follower sensing.

Note that FIG. 21 is one embodiment for sensing two different Vts using the same word line voltage. In one embodiment, source-follower sensing is used instead. FIG. 22 is a flowchart of one embodiment of a process 2200 of reading using source-follower sensing. Process 2200 may be used to read at two different levels using the same word line voltages. Process 2200 may be used during process 1100 to read at two different levels using the same word line voltages.

In step 2202, the common source line is charged up to Vdd ~2.5V. In step 2204, the selected bit lines are floated to charge up by current flowing from the common source line to the bit lines.

In step 2206, Vread is applied to the unselected word lines. In step 2208, Vcgrv is applied to the selected word line. Based on the threshold voltage of the selected memory cell on each NAND string, the memory cell may conduct a current. This current may flow from the source line to the bit line, thus charging the bit line. For a highly conductive cell, within certain sensing time, a higher current may flow, thus charging up the associated bit line to a higher voltage level. On the other hand, a non-conductive cell will not let any current flow, resulting in the bit line to stay at the initial level. Thus, by sensing the voltage level at the bit line, the state of the cell can be judged.

In step 2210, the bit lines are sensed for a first voltage level. In step 2212, the bit lines are sensed for a second voltage level. These two voltage levels are intended to test for slightly different threshold voltages. Thus, two threshold voltages that differ by, for example, 50 mV could be tested for using a single word line voltage.

Note that for both process 2200 and 2100, multiple thresholds were sensed using a single word line voltage, as opposed to shifting word line voltage levels to sense at two different thresholds. Therefore, any additional time needed for the word lines to settle between two different reads at two different Vcgrv levels, is mitigated.

In one embodiment, rather than using different read levels with each successive read, the same read level may be used for the two most recent reads. Thus, in one embodiment of steps 1102 and 1104, the same read levels is used for each read. Note that this still allows for mis-compares to be counted. Since the read level is not changed, the mis-compares may be caused by read noise, which causes a memory cell's threshold voltage to fluctuate from one read to another. If the read level is close to the valley between two threshold voltage distributions, there are fewer memory cells close to the read level, which means only few memory cell's threshold voltage can jump around due to read noise. This means the mis-compare count should be low. On the other hand, if the read level is further away from the valley, then there will a larger population of memory cells at that point in the threshold voltage distribution, then there would be much larger number of cells that can jump around in threshold voltage and count as mis-compare. Thus, the mis-compare count can still be used as a measure that is related to misreads (or fail bit count). Note that using the same read level for two reads may save time because the word line does not need to be ramped to a different voltage between the two successive reads.

One embodiment includes a method of operating non-volatile storage comprising the following. A determination is made whether non-volatile storage elements in a group have a threshold voltage that is above or below a first voltage level. A determination is made whether the non-volatile storage elements in the group have a threshold voltage that is above or below a second voltage level. A determination is made of a count of how many of the non-volatile storage elements in the group showed a different result between the first voltage level and the second voltage level. A determination is made whether the count is greater than a threshold. Data from the non-volatile storage elements is stored into a set of data latches without attempting to correct for misreads if the count is less than the threshold. Data from the non-volatile storage elements is stored into the set of data latches with correcting for misreads if the count is not less than the threshold. In one embodiment, the data stored in the set of data latches is used in a programming operation.

One embodiment includes a non-volatile storage device, comprising a memory die, a plurality of non-volatile storage elements on the memory die; and one or more managing circuits in communication with the plurality of non-volatile storage elements. The one or more managing circuits determine whether non-volatile storage elements in a group of the plurality of non-volatile storage elements have a threshold voltage that is above or below a first voltage level. The one or more managing circuits determine whether the non-volatile storage elements in the group have a threshold voltage that is above or below a second voltage level. The one or more managing circuits determine a count of how many of the non-volatile storage elements in the group showed a different result between the first voltage level and the second voltage level. The one or more managing circuits determine whether the count is greater than a threshold. The one or more managing circuits store data from the non-volatile storage elements into a set of data latches without attempting to correct for misreads if the count is less than the threshold. The one or more managing circuits store data from the non-volatile storage elements into the set of data latches with correcting for misreads if the count is not less than the threshold. In one embodiment, a programming operation is performed based on the data stored in the set of data latches.

One embodiment includes a method of operating non-volatile storage comprising: a) reading a first unit of data stored in a group of non-volatile storage elements on a memory die using a plurality of different read levels; b) storing results of reads at the two most recent different read levels on the memory die; c) determining a count of how many of the non-volatile storage elements in the group showed a different result between the reads at the two most recent read levels; d) determining whether a minimum of the count is greater than a threshold number when the count reaches the minimum; e) storing the first unit of data in a data latches on the memory die without applying error correction if the count is less than or equal to the threshold number; f) storing the first unit of data in the data latches on the memory die with applying error correction if the count is greater than the threshold number, including: reading the unit of data and error correction codes associated with the unit of data; using the error correction codes to correct misreads to generate corrected data; and storing the corrected data into the data latches.

One embodiment includes a non-volatile storage device, comprising a memory die, a plurality of non-volatile storage elements on the memory die, a plurality of data latches on the memory die, and one or more managing circuits in communication with the plurality of non-volatile storage elements and the plurality of data latches. The one or more managing circuits read a first unit of data stored in a group of the plurality of non-volatile storage elements using a plurality of different read levels. The one or more managing circuits store results of reads at the two most recent different read levels in a group of the plurality of data latches. The one or more managing circuits determine a count of how many of the non-volatile storage elements in the group showed a different result between the reads at the two most recent read levels. The one or more managing circuits determine when the count reaches a minimum. The one or more managing circuits determine whether the count is greater than a threshold number when the count reaches the minimum. The one or more managing circuits store the first unit of data in a set of data latches of the plurality of data latches without applying error correction if the minimum count is less than or equal to the threshold number, the one or more managing circuits read the unit of data and error correction codes associated with the unit of data if the minimum count is greater than the threshold number. The one or more managing circuits use the error correction codes to correct misreads to generate corrected data if the minimum count is greater than the threshold number. The one or more managing circuits store the corrected data into the set of data latches if the minimum count is greater than the threshold number.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope of embodiments be defined by the claims appended hereto.

What is claimed is:

1. A method of operating non-volatile storage, comprising:
determining whether non-volatile storage elements in a group have a threshold voltage that is above or below a first voltage level;
determining whether the non-volatile storage elements in the group have a threshold voltage that is above or below a second voltage level;
determining a count of how many of the non-volatile storage elements in the group showed a different result between the first voltage level and the second voltage level;
determining whether the count is greater than a threshold;
correcting for misreads of the non-volatile storage elements in the group if the count is not less than the threshold;
storing data from correcting the misreads into a set of data latches if the count is not less than the threshold; and
storing data from the non-volatile storage elements into the set of data latches without attempting to correct for misreads if the count is less than the threshold.

2. The method of claim 1, further comprising:
performing a programming operation based on the data stored in the set of data latches whether or not the count is less than the threshold.

3. The method of claim 1, wherein the data is a first page of data, and further comprising:
programming a second page of data into the group of non-volatile storage elements, the programming is based on the first page of data that is stored in the set of data latches.

4. The method of claim 1, wherein the group of non-volatile storage elements are a first group that store a single bit per storage element, and further comprising:
programming the data stored in the set of latches into a second group of non-volatile storage elements as a part of an operation that transfers data from non-volatile storage elements that store a single bit per storage element to non-volatile storage elements that store multiple bits per storage element.

5. The method of claim 1, wherein the determining whether non-volatile storage elements in the group have a threshold voltage that is above or below the first and second voltage levels are part of a sequence of determinations at different voltage levels in which a count is made of how many of the non-volatile storage elements in the group showed a different result between each successive determination, the determining whether the count is greater than a threshold is performed when the count reaches a minimum.

6. The method of claim 5, further comprising:
establishing a default read level for reading without using error correction codes based on the first or second voltage level that was used when the count reached the minimum.

7. The method of claim 6, wherein the storing data from the non-volatile storage elements into the set of data latches without correcting for misreads is performed based on a read level associated with the lowest count.

8. The method of claim 1, wherein the non-volatile storage elements are part of a three-dimensional memory array.

9. A non-volatile storage device, comprising:
a memory die;
a plurality of non-volatile storage elements on the memory die;
a set of data latches on the memory die; and
one or more managing circuits in communication with the plurality of non-volatile storage elements, the one or more managing circuits determine whether non-volatile storage elements in a group of the plurality of non-volatile storage elements have a threshold voltage that is above or below a first voltage level, the one or more managing circuits determine whether the non-volatile storage elements in the group have a threshold voltage that is above or below a second voltage level, the one or more managing circuits determine a count of how many of the non-volatile storage elements in the group showed a different result between the first voltage level and the second voltage level, the one or more managing circuits determine whether the count is greater than a threshold, the one or more managing circuits correct for misreads of the non-volatile storage elements in the group if the count is not less than the threshold, the one or more managing circuits store data from correcting the misreads into the set of data latches if the count is not less than the threshold, the one or more managing circuits store data from the non-volatile storage elements into the set of data latches without attempting to correct for misreads if the count is less than the threshold.

10. The non-volatile storage device of claim 9, wherein the one or more managing circuits perform a programming operation based on the data stored in the set of data latches whether or not the count is less than the threshold.

11. The non-volatile storage device of claim 9, wherein the data is a first page of data, the one or more managing circuits program a second page of data into the group of non-volatile storage elements based on the first page of data that is stored in the set of data latches.

12. The non-volatile storage device of claim 9, wherein the group of non-volatile storage elements are a first group that store a single bit per storage element, the one or more managing circuits program the data stored in the set of latches into a second group of the plurality of non-volatile storage elements as a part of an operation that transfers data from non-volatile storage elements that store a single bit per storage element to non-volatile storage elements that store multiple bits per storage element.

13. The non-volatile storage device of claim 9, wherein the one or more managing circuits determine whether non-volatile storage elements in the group have a threshold voltage that is above or below the first and second voltage levels as a part of a sequence of determinations at different voltage levels in which the one or more managing circuits make a count of how many of the non-volatile storage elements in the group showed a different result between each successive determination, the one or more managing circuits determine whether the count is greater than a threshold when the count reaches a minimum.

14. The non-volatile storage device of claim 13, wherein the one or more managing circuits establish a default read level for reading without using error correction codes based on the first or second voltage level that was used when the count reached the minimum.

15. The non-volatile storage device of claim 14, wherein the one or more managing circuits store the data from the non-volatile storage elements into the set of data latches without correcting for misreads based on a read level associated with the lowest count.

16. A non-volatile storage device, comprising:
a memory die comprising a three-dimensional memory array and a set of data latches;
the three-dimensional memory array comprising a plurality of non-volatile storage elements; and
one or more managing circuits in communication with the plurality of non-volatile storage elements, the one or more managing circuits are configured to determine whether non-volatile storage elements in a group of the plurality of non-volatile storage elements have a threshold voltage that is above or below a first voltage level, the one or more managing circuits are configured to determine whether the non-volatile storage elements in the group have a threshold voltage that is above or below a second voltage level, the one or more managing circuits are configured to determine a count of how many of the non-volatile storage elements in the group showed a different result between the first voltage level and the second voltage level, the one or more managing circuits are configured to determine whether the count is greater than a threshold, the one or more managing circuits are configured to correct for misreads of the non-volatile storage elements in the group if the count is not less than the threshold, the one or more managing circuits are configured to store data from correcting the misreads into the set of data latches if the count is not less than the threshold, the one or more managing circuits are configured to store data from the non-volatile storage elements into the set of data latches without attempting to correct for misreads if the count is less than the threshold.

17. The non-volatile storage device of claim 16, wherein the plurality of non-volatile storage elements each comprise a non-conductive dielectric material to store charge in a non-volatile manner.

\* \* \* \* \*